United States Patent
Baek et al.

(10) Patent No.: US 8,730,710 B2
(45) Date of Patent: May 20, 2014

(54) SEMICONDUCTOR MEMORY DEVICE HAVING STACKED STRUCTURE INCLUDING RESISTOR-SWITCHED BASED LOGIC CIRCUIT AND METHOD OF MANUFACTURING THE SAME

(71) Applicant: Samsung Electronics Co., Ltd., Suwon-si (KR)

(72) Inventors: In-gyu Baek, Seoul (KR); Hong-sun Hwang, Suwon-si (KR); Hak-soo Yu, Seongnam-si (KR); Chul-woo Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/017,856

(22) Filed: Sep. 4, 2013

(65) Prior Publication Data

US 2014/0008598 A1    Jan. 9, 2014

Related U.S. Application Data

(62) Division of application No. 13/224,410, filed on Sep. 2, 2011, now Pat. No. 8,553,445.

(30) Foreign Application Priority Data

Sep. 3, 2010   (KR) .................. 10-2010-0086581

(51) Int. Cl.
*G11C 11/00*   (2006.01)

(52) U.S. Cl.
USPC ............................................ 365/148; 365/163

(58) Field of Classification Search
USPC .............................................................. 365/148
See application file for complete search history.

(56) References Cited

U.S. PATENT DOCUMENTS

| | | | |
|---|---|---|---|
| 7,876,597 B2 * | 1/2011 | Liu ............................... | 365/148 |
| 7,920,408 B2 | 4/2011 | Azuma et al. | |
| 8,031,508 B2 * | 10/2011 | Toda et al. ................... | 365/148 |
| 8,105,884 B2 * | 1/2012 | Lee et al. ...................... | 438/128 |
| 2010/0232207 A1 | 9/2010 | Maejima et al. | |

FOREIGN PATENT DOCUMENTS

| | | |
|---|---|---|
| JP | 2009-099206 | 5/2009 |
| JP | 2009-266312 | 11/2009 |
| KR | 1020090027561 | 3/2009 |

* cited by examiner

*Primary Examiner* — Son Mai
(74) *Attorney, Agent, or Firm* — Volentine & Whitt, PLLC

(57) ABSTRACT

Semiconductor memory device having a stacking structure including resistor switch based logic circuits. The semiconductor memory device includes a first conductive line that includes a first line portion and a second line portion, wherein the first line portion and the second line portion are electrically separated from each other by an intermediate region disposed between the first and second line portions, a first variable resistance material film that is connected to the first line portion and stores data, and a second variable resistance material film that controls an electrical connection between the first line portion and the second line portion.

8 Claims, 31 Drawing Sheets

SEMICONDUCTOR MEMORY DEVICE HAVING STACKED STRUCTURE INCLUDING RESISTOR-SWITCHED BASED LOGIC CIRCUIT AND METHOD OF MANUFACTURING THE SAME

CROSS-REFERENCE TO RELATED APPLICATIONS

This application is a Divisional of application Ser. No. 13/224,410, filed Sep. 2, 2011, which issued as U.S. Pat. No. 8,553,445, on Oct. 8, 2013, and which claims the benefit of Korean Patent Application No. 10-2010-0086581, filed on Sep. 3, 2010, in the Korean Intellectual Property Office, the disclosure of which is incorporated herein in its entirety by reference.

BACKGROUND

The inventive concept relates to semiconductor memory devices having a stacked structure, and more particularly, to semiconductor memory devices having a stacked structure including a resistor-switch based logic circuit and a method of manufacturing the same.

With the development of industrial applications using multi-media systems, semiconductor devices for use in computers or mobile equipment are required to have a small size and be able to process a large capacity of data. Semiconductor memory devices are an example of this kind of semiconductor devices. In order to increase the degree of integration of semiconductor memory devices that are used to store data, multi-layer memory devices in which memory layers are three dimensionally stacked have been studied.

In general, a three dimensional memory device may be manufactured by forming a driving circuit on a lower substrate and stacking a semiconductor layer having a memory cell array on the lower substrate. A driving circuit region includes a plurality of logic circuits that support the operation of the memory device, and the memory cell array on the semiconductor layer stacked on an upper side of the memory device is electrically connected to the driving circuit region on the substrate through a global conductive line. In this case, as the number of the semiconductor layers to be stacked increases, an area of the driving circuit region for supporting the operation of memory increases, and the number of global conductive lines for connecting the semiconductor layers and the driving circuit region also increases. Therefore, there is a limit in increasing the degree of integration by stacking a plurality of semiconductor layers.

SUMMARY

The inventive concept provides a semiconductor memory device—and a corresponding module and system—wherein the degree of integration can be increased by stacking a further numbers of semiconductor layers on the same substrate area by removing limitations caused by the increase in the driving circuit region and the increase in the global conductive lines when a plurality of semiconductor layers are stacked, and a method of manufacturing the semiconductor memory device.

According to an aspect of the inventive concept, there is provided a semiconductor memory device including: a first conductive line that comprises a first line portion and a second line portion, wherein the first region and the second region are electrically separated from each other by an intermediate region between the first and second line portions; a first variable resistance material film that is connected to the first line portion and stores data; and a second variable resistance material film that controls an electrical connection between the first line portion and the second line portion.

According to another aspect of the inventive concept, there is provided a semiconductor memory device including: a resistive memory cell that is connected between word lines and bit lines and comprises a first variable resistance material film; and a resistor switch having first, second and third terminals, wherein the resistor switch comprises a second variable resistance material film and controls a current path between the second and third terminals in response to a switching control signal received by the first terminal, wherein each of the bit lines comprises a first line portion and a second line portion and the first and second line portions are electrically separated from each other by an intermediate region disposed between the first and second line portions, and the first line portion is connected to the resistive memory cell and the second terminal, the second line portion is connected to the third terminal, and the resistor switch is disposed at the intermediate region and controls a current path between the first and second line portions.

According to yet another aspect of the inventive concept, a device includes: a substrate; and a plurality of semiconductor layers disposed successively on each other and on the substrate, wherein each of the semiconductor layers includes a memory cell region comprising a plurality of memory cells, wherein at least some of the memory cells are resistive memory cells comprising a first variable resistance material. The substrate includes first control circuitry for accessing the memory cells of the plurality of semiconductor layers. Each of the semiconductor layers includes second control circuitry for cooperating with the first control circuitry for accessing the memory cells of the corresponding semiconductor layer. Control signals and data are communicated between the first control circuitry and the second control circuitry via electrically conductive lines extending between the substrate and the plurality of semiconductor layers, and at least one of the electrically conductive lines is shared between the second circuitry of each of the semiconductor layers

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
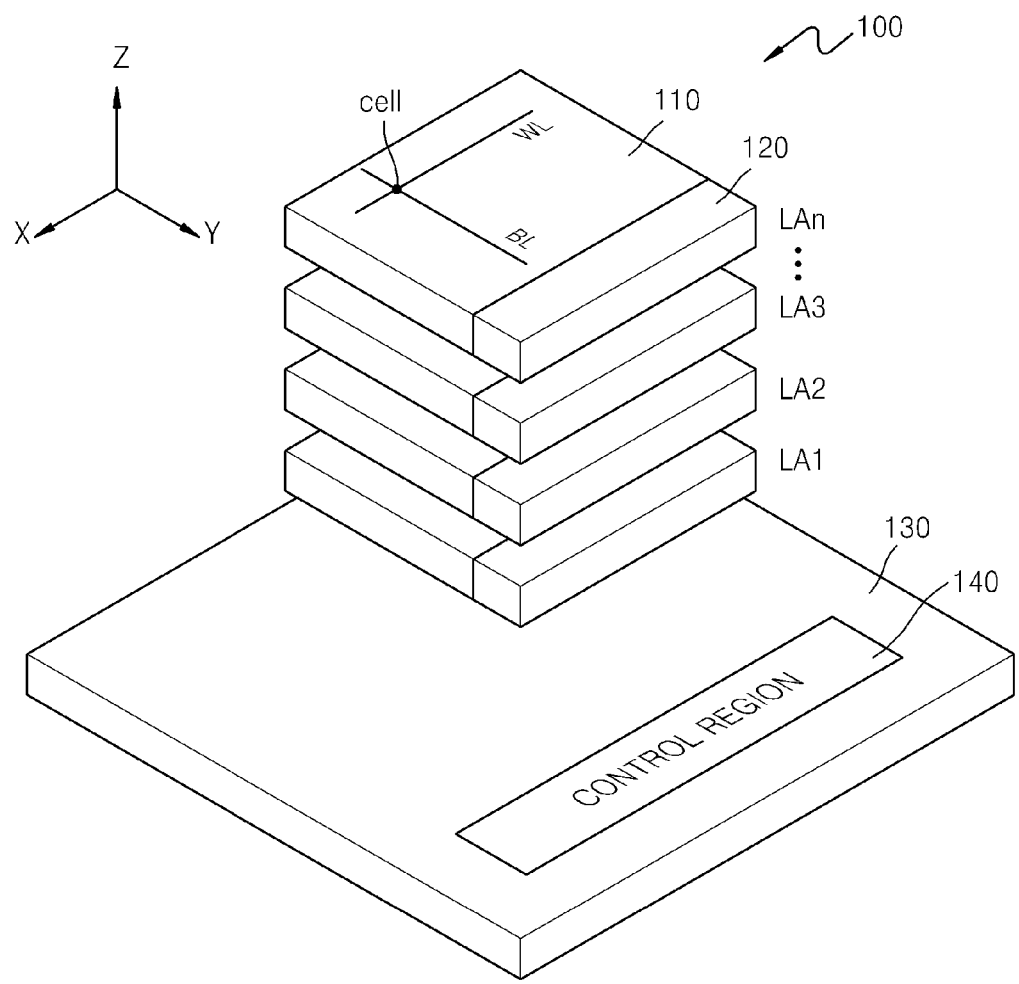
FIG. 1 is a perspective view of a structure of a semiconductor memory device having a three dimensional stacking structure according to an embodiment of the inventive concept.

To sufficiently understand the operational advantages and purposes that may be achieved by the present inventive concept, accompanied drawings showing embodiments of the present inventive concept and the contents of the drawings must be referred to.

The inventive concept will now be described more fully with reference to the accompanying drawings, in which exemplary embodiments of the inventive concept are shown. Like reference numerals in the drawings denote like elements.

FIG. 1 is a perspective view of the structure of a semiconductor memory device 100 having a three dimensional stacking structure according to an embodiment of the inventive concept. The semiconductor memory device 100 may include a substrate 130 and a plurality of semiconductor layers LA1 through LAn three dimensionally stacked on the substrate 130. Each of the semiconductor layers LA1 through LAn may include a memory cell region 110 and a logic region 120.

Memory cell region 110 may include a memory cell array. The memory cell array may be a volatile memory cell array, such as a dynamic random access memory (DRAM) cell array, or a static random access memory (SRAM) cell array, or a non-volatile memory cell array, such as a phase change random access memory (PRAM) cell array, a resistive random access memory (RRAM) cell array that uses a variable resistance characteristic of a material such as complex metal oxides, or a magnetic random access memory (MRAM) cell array that uses a ferromagnetic material. The semiconductor layers LA1 through LAn may commonly include memory cells employing one memory cell structure, such as any of the memory cell structures discussed above, or may respectively include memory cells employing different memory cell structures in each of the semiconductor layers LA1 through LAn.

Memory cell region 110 may include word lines WL disposed in an X axis direction, bit lines BL disposed in a Y axis direction crossing the X axis direction (e.g., perpendicular to the X axis direction), and memory cells respectively disposed at each crossing point between the word lines WL and the bit lines BL. The memory cells respectively may include one cell structures described above. For example, if memory cell region 110 is a RRAM, each of the memory cell may include one variable device R or one variable device R and one diode device D, and if memory cell region 110 is a PRAM, each of the memory cell may include one variable device R and one diode device D.

Semiconductor memory device 100 may include a driving circuit to control the operation of the memory cell array. The driving circuit may include a plurality of logic circuits, and according to the current inventive concept, some of the logic circuits may be disposed on substrate 130, and the rest of the logic circuits may be respectively disposed on the semiconductor layers LA1 through LAn. Devices of the logic circuits respectively disposed on the semiconductor layers LA1 through LAn may be controlled by logic circuits disposed on substrate 130. Therefore, a region of each of the semiconductor layers LA1 through LAn on which the logic circuit is disposed is referred to herein as logic region 120, and a region of the substrate 130 on which the logic circuit is disposed is referred to herein as a control region 140.

If the memory cell is a non-volatile memory that uses a variable resistance material, the logic circuit including a resistor switch is realized using the same material as, or a material similar to, the material used to form the variable resistance material of the memory cell. Accordingly, of the logic circuits that constitute the driving circuit, a complementary metal-oxide semiconductor (CMOS) logic circuit is disposed in control region 140 of substrate 130, and the logic circuit that includes the resistor switch is disposed in logic region 120 of the non-silicon based semiconductor layers LA1 through LAn.

Logic region 120 may include some of the driving circuits for driving the memory. For example, logic region 120 may include some of the logic circuits such as an address decoder, a read/write control circuit, and an output buffer and compensation circuit that supports the operation of the memory. Besides the above, of the various driving circuits, the driving circuits that may be realized by using the resistor switch that may be disposed in logic region 120. Accordingly, even though a plurality of the semiconductor layers LA1 through LAn is stacked on substrate 130, an increase in the size of control region 140 of the substrate 130 to drive the semiconductor layers LA1 through LAn in proportion to an increase in the number of the semiconductor layers LA1 through LAn may be prevented, and the area burden of substrate 130 may be relieved.

Control region 140 forms an interface with an external controller (not shown), and also controls a read and write operation of data by controlling access of the semiconductor layers LA1 through LAn. Control region 140 may include a logic circuit that generates a signal for controlling logic region 120 of the semiconductor layers LA1 through LAn, and is connected to memory cell region 110 and logic region 120 through a plurality of global conductive lines (not shown).

Figure 2A:
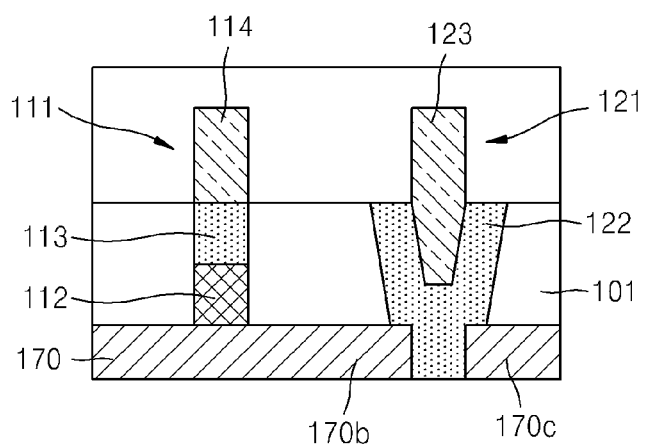
FIGS. 2A through 2D are cross-sectional views of a resistive memory, a resistor switch, and circuit diagrams thereof according to an embodiment of the inventive concept.
Figure 2B:
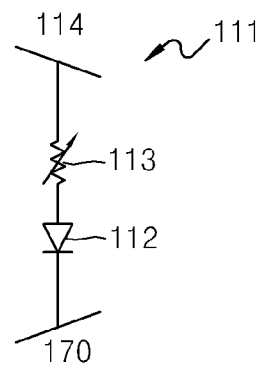
Figure 2C:
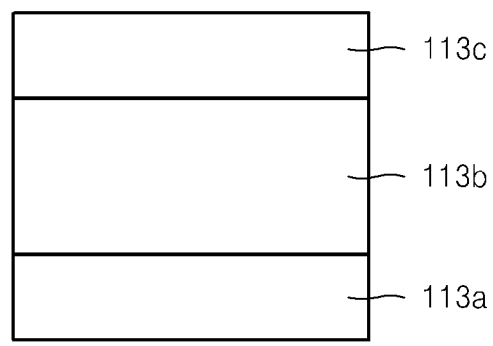
Figure 2D:
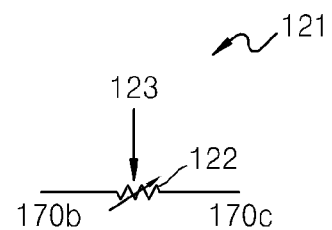

FIG. 2A is a cross-sectional view of a structure of a resistive memory and a resistor switch of a semiconductor memory device according to an embodiment of the inventive concept. Memory cell region 110 of FIG. 1 includes a plurality of resistive memories, and logic region 120 of FIG. 1 includes a plurality of resistor switches. A resistive memory 111 and a resistor switch 121 of FIG. 2A respectively indicate a unit cell structure of the resistive memory disposed in memory cell region 110 and a resistor switch disposed in logic region 120. FIG. 2B and FIG. 2D respectively show circuits of resistive memory 111 and resistor switch 121, and FIG. 2C shows an example of the configuration of a first variable resistance material film 113.

Referring to FIGS. 2A and 2B, resistive memory 111 may include first variable resistance material film 113, a switching device 112, upper and lower conductive lines 170 and 114. One of the upper and lower conductive lines 170 and 114, for example the lower conductive line 170, may be a bit line, and the other one, for example the upper conductive line 114, may be a word line.

In some embodiments, switching device 112 may be omitted. However, for the purpose of preventing mutual interference between the cells and power loss due to current leakage, switching device 112 may be included. Switching device 112 may be a diode, a varistor, or a threshold switch. However, in order to maximize the degree of integration, switching device 112 may be designed to be of a cross-point type by using a unit device having a simple structure such as 1D(diode)-1R(resistor). The diode may be one of a P—N diode that has a rectifying characteristic by a p-n bonding, a Schottky diode that has a rectifying characteristic by a Schottky bonding, or a Zener diode. Referring to FIGS. 2A and 2C, first variable resistance material film 113 may further include a first electrode 113a and a second electrode 113b in addition to a variable resistance material 113b.

Variable resistance material 113b may be a transition metal oxide (TMO), for example, one selected from the group consisting of a titanium oxide ($TiO_x$), a nickel oxide ($NiO_x$) a tantalum oxide ($TaO_x$), a tungsten oxide ($WO_x$), a hafnium oxide ($HfO_x$), an aluminum oxide ($Al_xO_x$), a strontium titanium oxide ($SrTiO_x$), a zirconium oxide ($ZrO_x$), and a zinc oxide ($ZnO_x$), or a combination of these metal oxides. A material for forming variable resistance material 113b may be a solid electrolyte, for example, $Ag_2S$, $Cu_2S$, and a chalcogenide group compound, or a material that allows variable switching of resistance, such as a perovskite group compound. In order to realize a high non-volatile memory device, a material having a large ratio between a resistance value at a low resistance state and a resistance value at a high resistance state, and having a low driving voltage in order to reduce power consumption, may be selected as variable resistance material 113b. Variable resistance material 113b may be formed by using a chemical vapor deposition (CVD) method or an atomic layer deposition method as well known in the art.

First electrode 113a and second electrode 113c may be oxidation resistance metal layers. For example, first electrode 113a and the second electrode 113c may be films one selected from the group consisting of an iridium (Ir) film, a platinum (Pt) film, a tungsten (W) film, an iridium oxide (IrO) film, a titanium nitride (TiN) film, a titanium aluminum nitride (TiAlN) film, a ruthenium (Ru) film, and a ruthenium oxide (RuO) film. Also, the first electrode 113a and the second electrode 113c may be poly silicon films.

In FIG. 2C, first electrode 113a, variable resistance material film 113b, and second electrode 113c are depicted as a single layer, but may be a multi-layer structure including an appropriate barrier film. Also, when upper conductive line 114 functions as second electrode 113c, second electrode 113c may be omitted.

According to another embodiment of the current inventive concept, a buffer layer may be added between first electrode 113a and second electrode 113c. The buffer layer may be formed of an oxide selected from the group consisting of an iridium oxide ($IrO_x$), an aluminum oxide ($Al_xO_x$), a magnesium oxide ($Mg_xO_x$) and a tantalum oxide ($Ta_xO_x$).

Referring to FIGS. 2A and 2D, resistor switch 121 may include a second variable resistance material film 122, upper conductive line 123, and lower conductive line portions 170b and 170c that constitute three terminals. Second variable resistance material film 122 is connected to upper conductive line 123 to transmit a control signal to resistor switch 121 so that the resistor switch 121 performs a switching operation, and fills a gap between the lower conductive line portions 170b and 170c. Also, second variable resistance material film 122 may be formed of the same material as first variable resistance material film 113, and may be simultaneously formed in the same process for forming first variable resistance material film 113.

Resistor switch 121 is a device that changes a current between a source and a drain according to a voltage applied to a gate, like a transistor, and thus, may be substituted for a transistor one-for-one in a conventional transistor based driving circuit.

For example, of lower conductive line portions 170b and 170c, a first terminal 170b connected to resistive memory 111 may operate as a source, and a second terminal located opposite to the source may operate as a drain. Also, upper conductive line 123 may be a third terminal that operates as a gate electrode. If second variable resistance material film 122 is formed of a solid electrolyte such as $Ag_2S$ or $Cu_2S$, when a positive voltage is applied to gate electrode 123, a current path is formed between source 170b and the drain 170c, and thus, resistor switch 121 is turned ON, and when a negative voltage is applied to gate electrode 123, resistor switch 121 is turned OFF. At this point, the current path formed by gate electrode 123 may be formed at a position separated from the gate electrode 123 and each state is a non-volatile state. If second variable resistance material film 122 is formed of a transition metal oxide, an ON/OFF state is determined according to the voltages of opposite polarities described above. Examples of resistor switch 121 are a nano-bridge device disclosed in the article "Three terminal solid-electrolyte nanometer switch" by T. Sakamoto, published in International Electron Device Meeting (IEDM), 2005, and one device disclosed in US Patent Publication No. 2008/0079029.

Upper conductive line 114 as a word line of resistive memory 111 and upper conductive line 123 as a gate electrode of resistor switch 121 may be provided in the same conductive line formation process. Also, resistive memory 111 and resistor switch 121 are insulated from each other by an insulating film 101. Insulating film 101 may be a silicon oxide film, a silicon nitride film, or a combination layer of these films.

Figure 3:
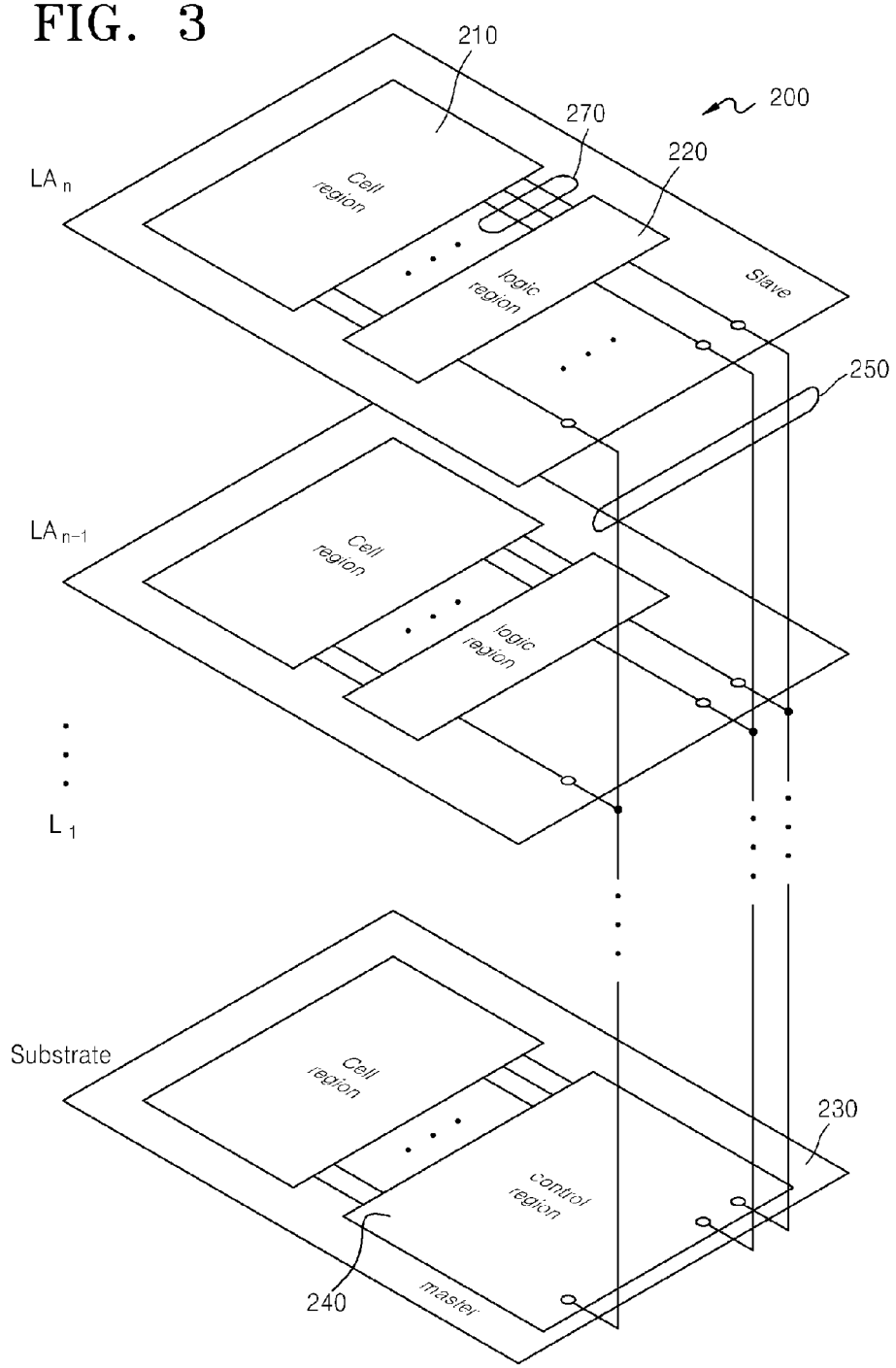
FIG. 3 is a block diagram showing an example of realizing a global conductive line of a semiconductor memory device according to an embodiment of the inventive concept.

FIG. 3 is a block diagram showing an example of realizing a global conductive line of a semiconductor memory device 200 according to an embodiment of the inventive concept.

Semiconductor memory device 200 may include a semiconductor substrate 230 and a plurality of semiconductor layers LA1 through LAn stacked on the semiconductor substrate 230. The semiconductor layers LA1 through LAn respectively may include a memory cell region 210 in which memory cells are disposed and a logic region 220 in which logic circuitry is disposed, and memory cell region 210 and logic region 220 are electrically connected to each other through one or more local lines 270 on each of the semiconductor layers LA1 through LAn. The lowermost semiconductor substrate 230 may include a control region 240 in which CMOS based logic circuitry is disposed. Semiconductor substrate 230 and the semiconductor layers LA1 through LAn transmit signals to each other through a global conductive line 250. Control region 240 is connected to memory cell region 210 and logic region 220 of each of the semiconductor layers LA1 through LAn through global conductive line 250. In FIG. 3, it is depicted as an example that the global conductive line 250 is disposed between logic region 220 and control region 240. Global conductive line 250 line transmits signals between semiconductor substrate 230 and the semiconductor layers LA1 through LAn. Also, in semiconductor memory device 200, if an interface with an external device is performed and a memory operation is controlled by control region 240 disposed on semiconductor substrate 230, semiconductor substrate 230 may be defined as a master region and the semiconductor layers LA1 through LAn may be defined as a slave region.

As depicted in FIG. 3, since logic region 220 that includes logic circuits respectively is disposed in the semiconductor layers LA1 through LAn, the number of global conductive lines 250 to be disposed on the semiconductor memory device 200 may be reduced. For example, if logic region 220 is a column decoder in which memory cell regions 210 are respectively connected to bit lines, local lines 270 corresponding to the number of the bit lines are disposed on each of the semiconductor layers LA1 through LAn. Also, since only one global conductive line 250 corresponding to at least two local lines 270 is provided in semiconductor memory device 200 and data are sequentially transmitted from local lines 270 to control region 240 through global conductive line 250, an area occupied by the global conductive lines 250 in semiconductor memory device 200 may be reduced.

Figure 4:
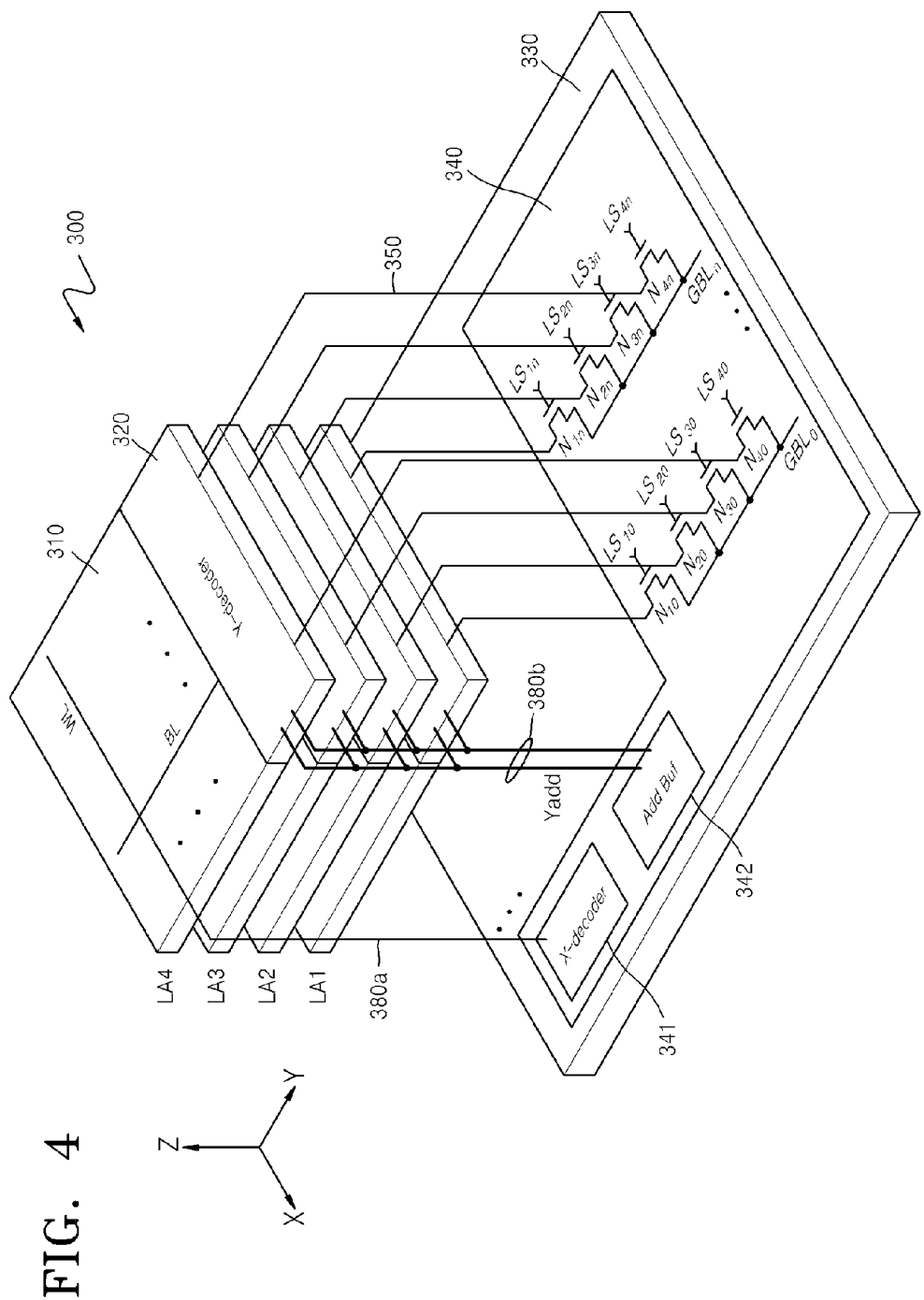
FIG. 4 is a block diagram showing a three dimensionally realized semiconductor memory device using the semiconductor memory device of FIG. 1.

FIG. 4 is a block diagram showing a three dimensionally realized semiconductor memory device 300 using semiconductor memory device 100 of FIG. 1. Semiconductor memory device 300 may have a structure in which a semiconductor substrate 330 and a plurality of semiconductor layers LA1 through LA4 are three dimensionally stacked. In FIG. 4, as an example, four semiconductor layers LA1 through LA4 are stacked on semiconductor substrate 330. Semiconductor layers LA1 through LA4 respectively may include a memory cell region 310 and a logic region 320. Memory cell region 310 may include word lines WL, bit lines BL, and memory cells 311 disposed at each crossing point of the word lines and the bit lines.

Semiconductor substrate 330 may include a control region 340 in which CMOS based logic circuits are disposed. The control region 340 generates various signals to control the operation of the semiconductor layers LA1 through LA4. For example, control region 340 includes a row decoder 341 that generates word line signals by decoding a row address. Row decoder 341 supplies a word line voltage to memory cell regions 310 of each of the semiconductor layers LA1 through LA4 through word line signal lines 380a as global conductive lines. Also, control region 340 generates signals for controlling logic regions 320 of each of the semiconductor layers LA1 through LA4 and transmits the signals to logic regions 320. Control region 340 is electrically connected to logic regions 320 of the semiconductor layers LA1 through LA4 through different global conductive lines 350 and 380b.

A driving circuit included in semiconductor memory device 300 may include a plurality of logic circuits for driving memories. Some of the logic circuits are disposed in logic region 320 of each of the semiconductor layers LA1 through LA4, and the rest of the logic circuits are disposed in control region 340. If a column decoder Y-decoder as a logic circuit is disposed in logic region 320, each of the column decoder Y-decoders of the semiconductor layers LA1 through LA4 receives a column address Yadd from an address buffer 342 through a global line, for example, a column address line 380b, and transmits data to memory cell region 310 through a bit line in response to the received column address Yadd or transmits data from memory cell region 310 to control region 340 through a global conductive line, for example, data line 350. If address buffer 342 stores the row address together, the row address may be supplied to row decoder 341 of the control region 340.

The column decoder Y-decoder may include a decoding circuit for decoding a received column address and a switching circuit for controlling the selection of bit lines in response to the decoded address. Data is transmitted to memory cell region 310 and control region 340 through the bit lines selected by a switching operation.

A predetermined number of local bit lines horizontally arranged on each of the semiconductor layers LA1 through LA4 may be defined as one group, one data line 350 is disposed per group, and accordingly, data for a predetermined number of local bit lines is sequentially transmitted to control region 340. The data sequentially transmitted to control region 340 is transmitted to the outside of semiconductor memory device 300 through global bit lines GBL0 through GBL4. In FIG. 4, data lines 350 are depicted separately from each other and respectively corresponding to the semiconductor layers LA1 through LA4.

Control switches N10 through N4n are disposed on control region 340 to control connections between the data of the semiconductor layers LA1 through LA4 and the global bit lines GBL0 through GBL4. Control switches N10 through N4n are switched in response to selected control signals LS10 through LS4n, and a data access with respect to corresponding layer and bit line is performed based on the switching operation.

Column address line 380b may be shared by the semiconductor layers LA1 through LA4, and the number of column address lines 380b that supply the column address Yadd to the semiconductor layers LA1 through LA4 is smaller than the number of local bit lines, the selection of which is controlled by the column address Yadd.

Figure 5:
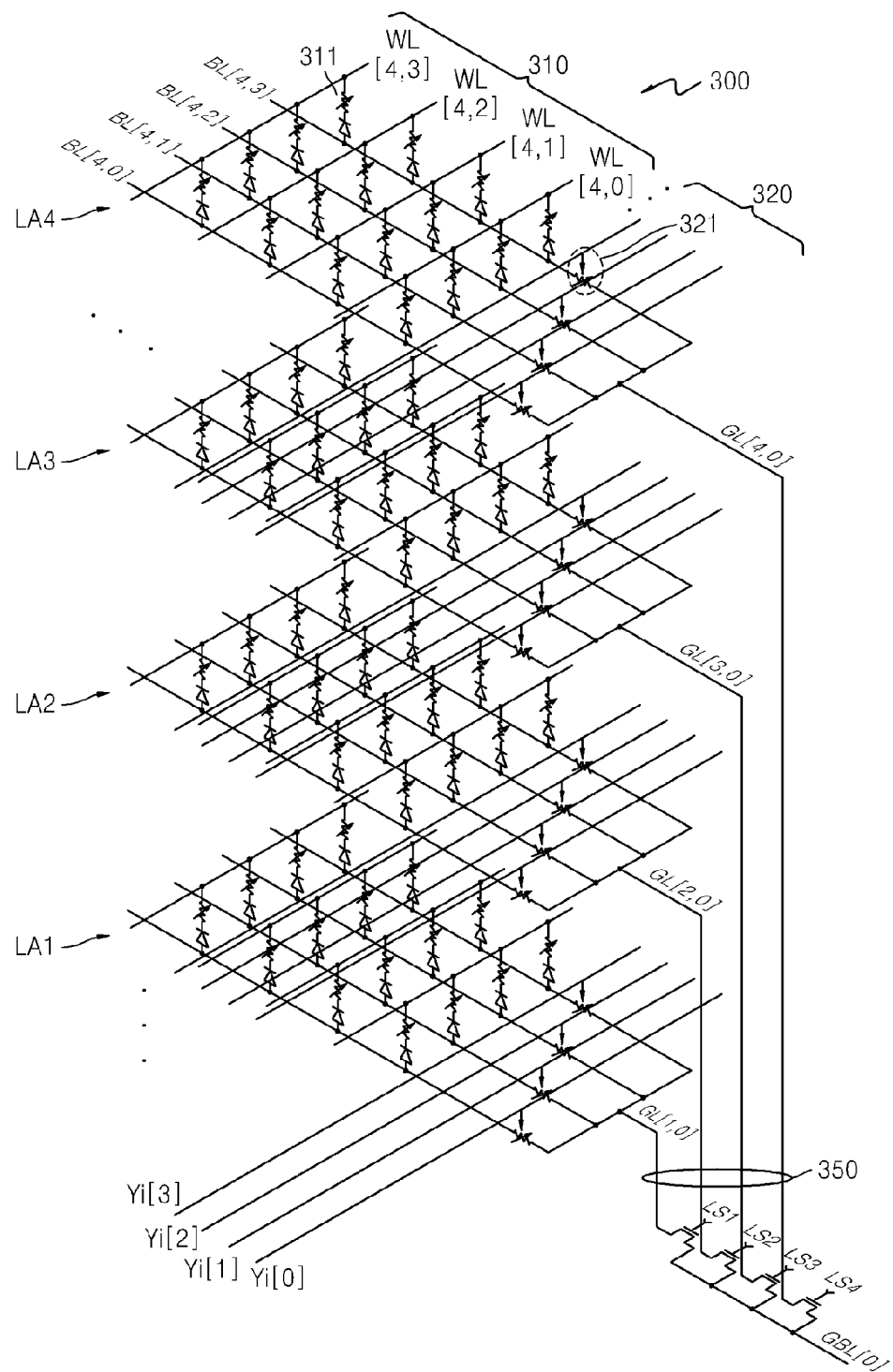
FIG. 5 is a circuit diagram showing an example of realizing a resistive memory from the semiconductor memory device of FIG. 4.

FIG. 5 is a circuit diagram showing an example of realizing a resistive memory from the semiconductor memory device of FIG. 4. The semiconductor layers LA1 through LA4 respectively may include memory cell region 310 and logic region 320, and logic region 320 may include a column decoder Y-decoder.

Memory cell region 310 may include word lines WL, bit lines BL, and memory cells 311 respectively disposed at a crossing point between the word lines WL and the bit lines BL. Memory cells 311 may be resistive memory cells that respectively include a variable resistance device and a diode. As another example of realizing memory cell region 310, a bit line BL and an inverted bit line /BL is disposed with the word line WL in the center of memory cell region 310, and two variable resistance devices may be symmetrically disposed between the bit line BL and the inverted bit line /BL.

The column decoder of each of the semiconductor layers LA1 through LA4 performs a decoding operation by receiving a column address (not shown), and generates control signals Yi[0] through Yi[3] for selecting a bit line BL. The column decoder includes a plurality of resistor switches 321 for controlling the selection of bit lines BL, and the resistor switches 321 are controlled by the control signals Yi[0] through Yi[3]. In FIG. 5, it is depicted that four bit lines BL are defined as one group and, as an example, the four bit lines BL[4,0] through BL[4,3] of the fourth semiconductor layer LA4 are connected to one data line GL[4,0]. Data transmitted through the four bit lines BL[4,0] through BL[4,3] is transmitted to the global bit line GBL[0] through the data line GL[4,0].

Figure 6:
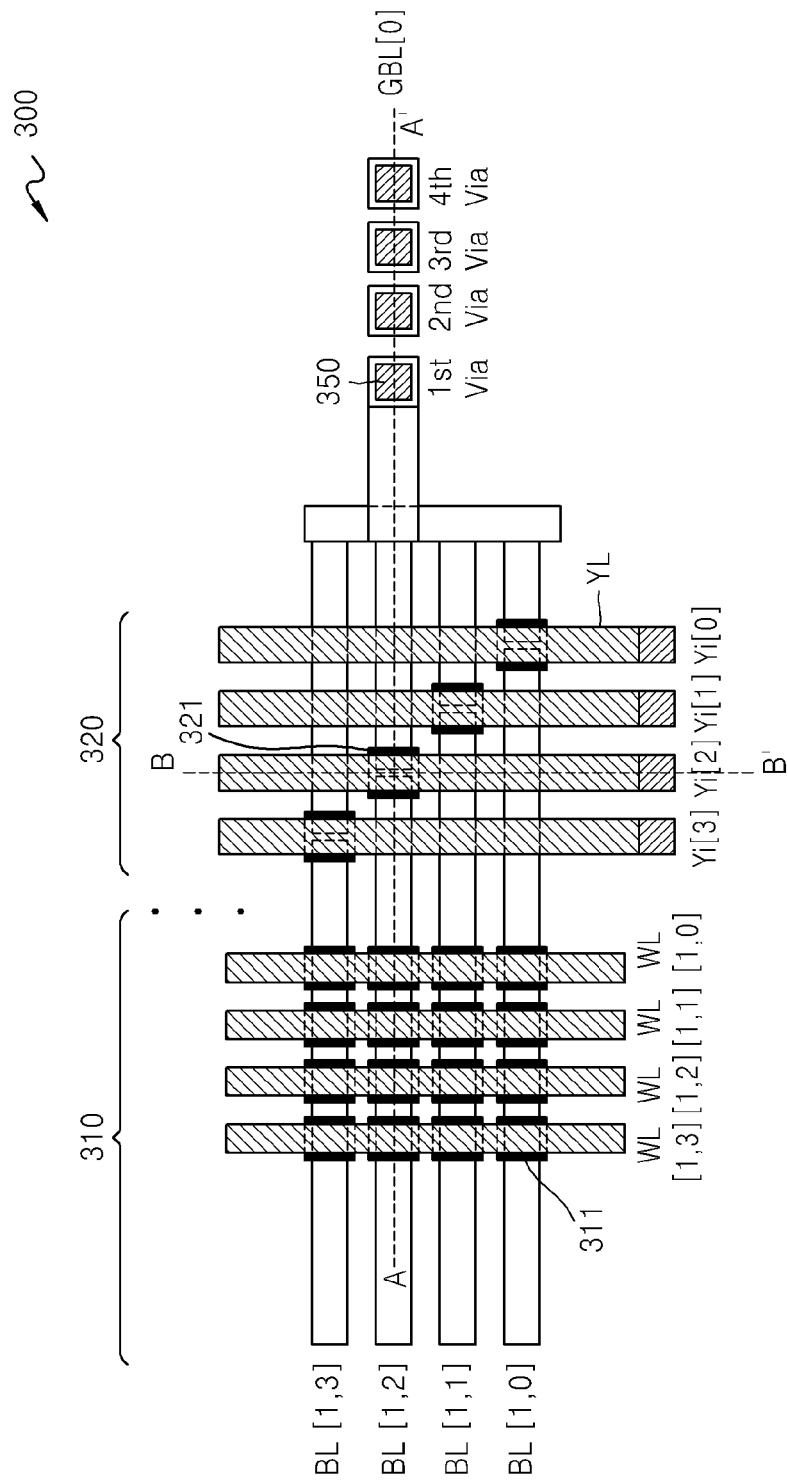
FIG. 6 is a plan view of a layout of a portion of the first layer of the semiconductor memory device of FIG. 5.

FIG. 6 is a plan view of a layout of a portion of the first layer LA1 of semiconductor memory device 300 of FIG. 5. The layout may be divided into memory cell region 310 and logic region 320. For convenience of explanation, in FIG. 6, four word lines WL[1,0] through WL[1,3], four bit lines BL[1,0] through BL[1,3], and memory cells 311 corresponding to the word lines WL[1,0] through WL[1,3] and the bit lines BL[1,0] through BL[1,3] are depicted. Memory cells 311 may be resistive memories that include resistive devices.

In logic region 320, the bit lines BL[1,0] through BL[1,3] and control signal lines YL respectively are disposed to cross each other. The bit lines BL[1,0] through BL[1,3] respectively have patterned sections in logic region 320, and resistor switches 321 are disposed corresponding to the patterned sections of the bit lines BL[1,0] through BL[1,3]. Also, resistor switches 321 are controlled in response to the control signals Yi[0] through Yi[3]. The four bit lines BL[1,0] through BL[1,3] are connected to control region 340 of semiconductor substrate 330 through vertically disposed data line 350. When resistor switches 321 are turned on in response to the control signals Yi[0] through Yi[3], the bit lines BL on both sides of the patterned sections are electrically connected to each other.

Figure 7:
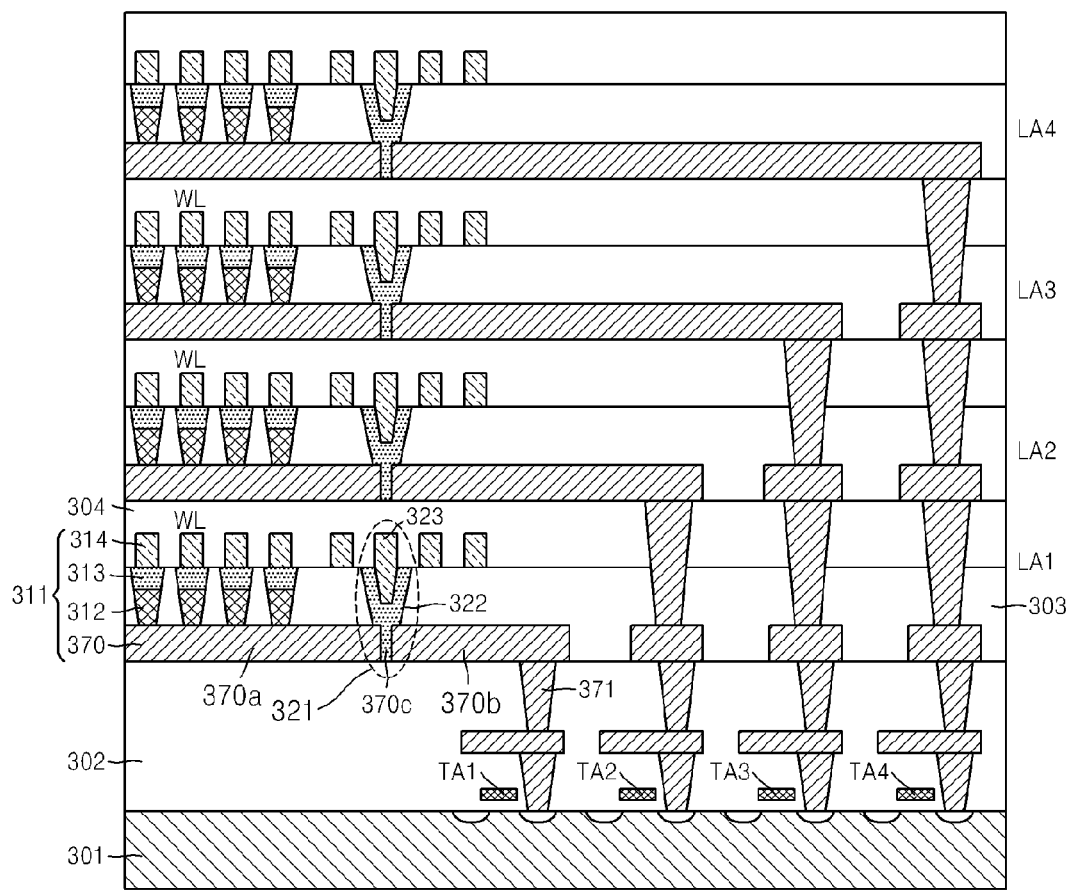
FIG. 7 is a cross-sectional view taken along line A-A' of FIG. 6.

FIG. 7 is a cross-sectional view taken along line A-A' of FIG. 6. A first interlayer insulating film 302 that includes first through fourth access transistors TA1 through TA4 are disposed on a semiconductor substrate 301. First interlayer insulating film 302 may be a silicon oxide film.

A first conductive line 370 that includes a first line portion 370a and a second line portion 370b may be disposed on first interlayer insulating film 302, and first line portion 370a and second line portion 370b are electrically separated from each other through forming an intermediate region 370c by patterning a portion of a section of first conductive line 370. A first access transistor TA1 is connected to first conductive line 370 through a contact plug 371. First conductive line 370 may be a bit line BL of a resistive memory.

A second interlayer insulating film 303 is further formed on first conductive line 370. A first variable resistance material film 313 of resistive memory 311 may be disposed in second interlayer insulating film 303, and a second variable resistance material film 322 included in resistor switch 321 is formed on a position of second interlayer insulating film 303 corresponding to intermediate region 370c of first conductive line 370. First and second variable resistance material films 313 and 322 may be formed by the same resistive device coating process.

More specifically, a diode 312 formed by stacking oxide layers or silicon layers is positioned under first variable resistance material film 313. Diode 312 is a vertical diode, and may have a stack structure in which a p-type oxide layer and an n-type oxide layer are sequentially stacked or a p-type silicon layer and an n-type silicon layer are sequentially stacked. In a modified structure, a threshold device as a switching device may be used instead of diode 312. According to another embodiment of the present inventive concept, diode 312 may be positioned above first variable resistance material film 313 or diode 312 may be omitted.

First variable resistance material film 313 may be formed of a transition metal oxide (TMO) of one selected from the group consisting of $TiO_x$, $NiO_x$, $TaO_x$, $WO_x$, $HfO_x$, $Al_xO_x$, $SrTiO_x$, $ZrO_x$, $ZnO_x$, and a composite of these metal oxides. Also, first variable resistance material film 313 may be formed of a solid-electrolyte, for example, $Ag_2S$, $Cu_2S$, or a chalcogenide group compound, or a material that allows variable switching of resistance, such as a perovskite group compound. Second variable resistance material film 322 may be formed of the same material as first variable resistance material film 313. A second conductive line 323 may be disposed on second variable resistance material film 322 to control the switching operation of resistor switch 321.

A plurality of parallel second conductive lines 314 and 323 may be provided by the same process, and also disposed on second interlayer insulating film 303. Second conductive lines 314 and 323 include word lines 314 of resistive memory 311 and control lines 323 of resistor switch 321. Word lines 314 and control lines 323 of the second conductive lines 314 and 323 may have different widths than each other. In some embodiments, second conductive lines 314 and 323 may form a 90° angle with first conductive line 370 when seen from a plan view. A first layer is formed by including a third interlayer insulating film 304 having a height greater than or the same as that of the second conductive lines 314 and 323. Above the first layer, a plurality of layers LA having the same structure is vertically stacked. The layers LA respectively are connected to the access transistors TA located on the semiconductor substrate 301 through contact plugs to receive signals for the layers LA to access the access transistors TA. For example, the first layer LA1 may be connected to the access transistor TA1 through the contact plug 371.

Figure 8:
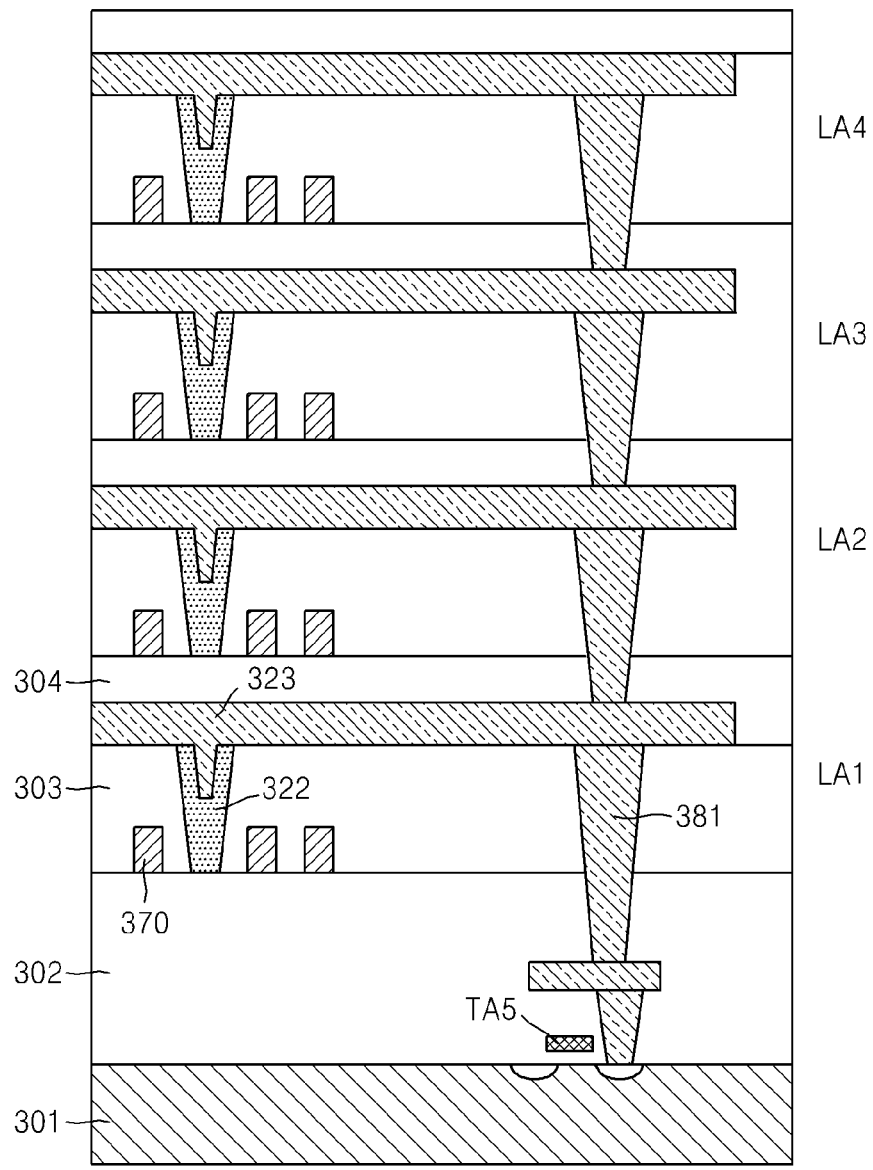
FIG. 8 is a cross-sectional view taken along line B-B' of FIG. 6.

FIG. 8 is a cross-sectional view taken along line B-B' of FIG. 6. First interlayer insulating film 302 having an access transistor TA5 is disposed on the semiconductor substrate 301. First conductive lines 370 separated from each other are disposed on first interlayer insulating film 302. First conductive lines 370 may operate as bit lines. As described above, a portion of the section of first conductive line 370 may be patterned, and second variable resistance material film 322 may be disposed on the patterned region. Second interlayer insulating film 303 having the same height as second variable resistance material film 322 is formed, and second conductive line 323 is disposed on second interlayer insulating film 303. Second conductive line 323 may operate as a control signal line. The first layer LA1 is formed by disposing third interlayer insulating film 304 having a height greater than or the same as that of second conductive line 323. A plurality of layers LA2 through LA4 having the same structure as the first layer LA1 is vertically stacked. Second conductive line 323 is electrically connected to the access transistor TA5 located on semiconductor substrate 301 through a contact plug 381. Each of the semiconductor layers LA1 through LA4 receives an address through contact plug 381, and a control signal generated as a result of decoding the received address is transmitted through second conductive line 323. The stacked layers LA1 through LA4 may share the access transistor TA5 and contact plug 381.

FIGS. 9A through 9H are cross-sectional views for explaining a method of manufacturing a semiconductor memory device according to an embodiment of the inventive concept.

Figure 9A:
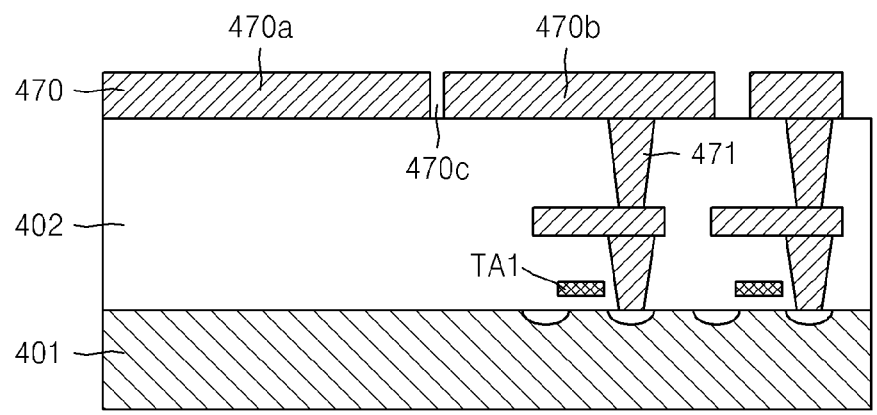
FIGS. 9A through 9H are cross-sectional views for explaining a method of manufacturing a semiconductor memory device according to an embodiment of the inventive concept.

Referring to FIG. 9A, a first interlayer insulating film 402 that includes a plurality of access transistors TA1 may be formed on a semiconductor substrate 401. The access transistors TA1 are connected to contact plugs 471. A first conductive line 470 that includes a first line portion 470a and a second line portion 470b may be disposed on first interlayer insulating film 402, and an intermediate region 470c may be formed by patterning a portion of a section between first line portion 470a and a second line portion 470b. First conductive line 470 may be formed of a material having a high conductivity, for example, one selected from the group consisting of W, Al, TiN, and Cu. First conductive line 470 may operate as a bit line of a resistive memory.

A hard mask film (not shown) is formed on first conductive line 470 to form intermediate region 470c on first conductive line 470. The hard mask film may be formed by depositing a silicon oxide. Afterwards, a hard mask pattern (not shown) is formed by patterning the hard mask film. Intermediate region 470c of first conductive line 470 may be formed by patterning first conductive line 470 using the hard mask pattern as an etch mask.

Figure 9B:
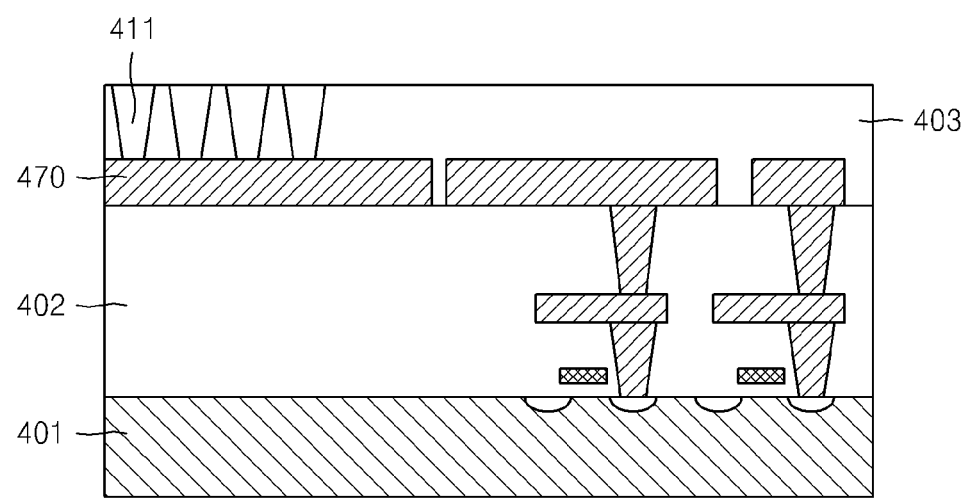

Referring to FIG. 9B, a second interlayer insulating film 403 is disposed on first conductive line 470. Afterwards, a plurality of first holes 411 that expose a portion of first line portion 470a of first conductive line 470 are formed.

Figure 9C:
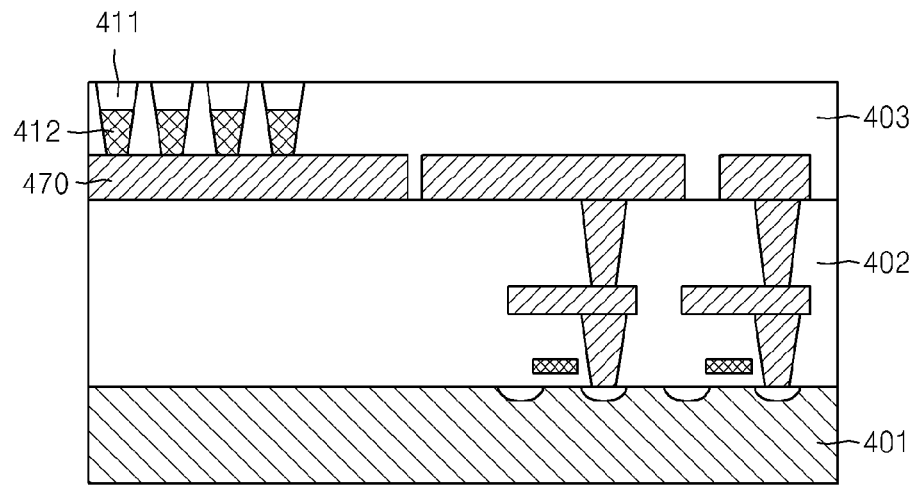

Referring to FIG. 9C, diodes 412 may be formed by stacking oxide layers or silicon layers in a portion of first holes 411. Diodes 412 are vertical diodes, and may have a structure in which p-type oxide layers and n-type oxide layers are sequentially stacked or p-type silicon layers and n-type silicon layers are sequentially stacked. For example, diodes 412 may have a stacking structure in which p-type layers such as CuO layers and n-type layers such as InZnO layers are sequentially stacked. In a modified structure, a threshold device as a switching device may be used instead of the diode, and also, the diode may be one of various diodes having different structures instead of a conventional pn diode.

Figure 9D:
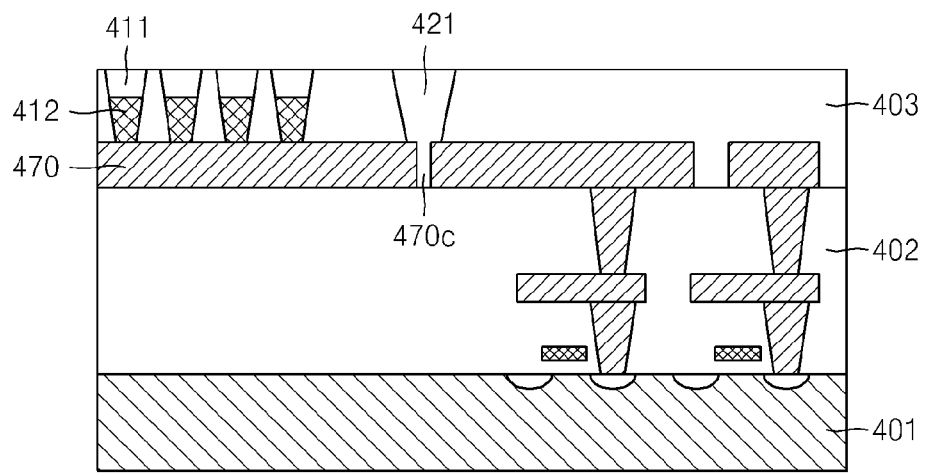

Referring to FIG. 9D, a second hole 421 that exposes intermediate region 470c of first conductive line 470 may be formed on second interlayer insulating film 403.

Figure 9E:
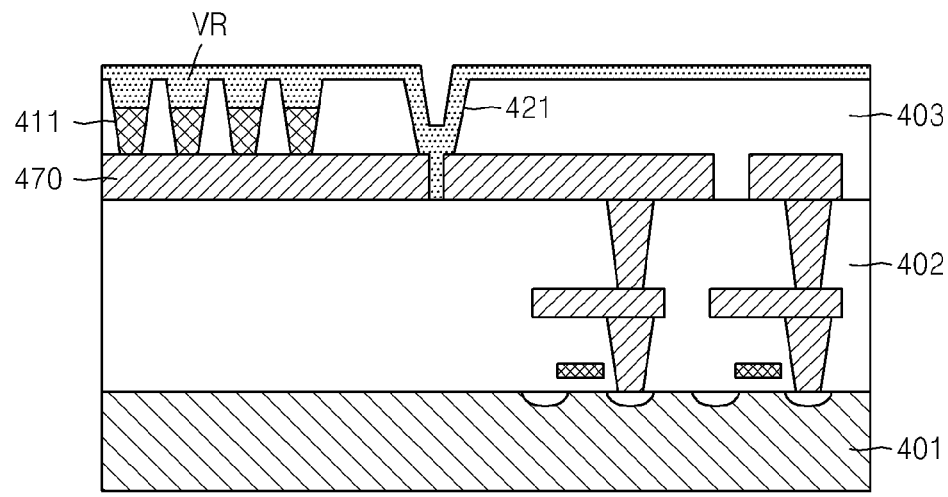

Referring to FIG. 9E, a variable resistance material VR is deposited on second interlayer insulating film 403 in which first holes 411 and second hole 421 are formed. The variable resistance material VR may be a transition metal oxide (TMO), for example, one selected from the group consisting of $TiO_x$, $NiO_x$, $TaO_x$, $WO_x$, $HfO_x$, $Al_xO_x$, $SrTiO_x$, $ZrO_x$, $ZnO_x$, and a composite of these metal oxides. Also, the variable resistance material VR may be a solid-electrolyte, for example, $Ag_2S$, $Cu_2S$, or a chalcogenide group compound, or a material that allows variable switching of resistance, such as a perovskite group compound. In order to realize a high volatility memory device, the variable resistance material VR may be a material having a large ratio between a resistance value at a low resistance state and a resistance value at a high resistance state and having a low driving voltage to reduce power consumption. The variable resistance material VR may be formed on second interlayer insulating film 403 by an oxygen reactive sputtering process, a chemical vapor deposition (CVD) process, or an atomic layer deposition (ALD) process.

Figure 9F:
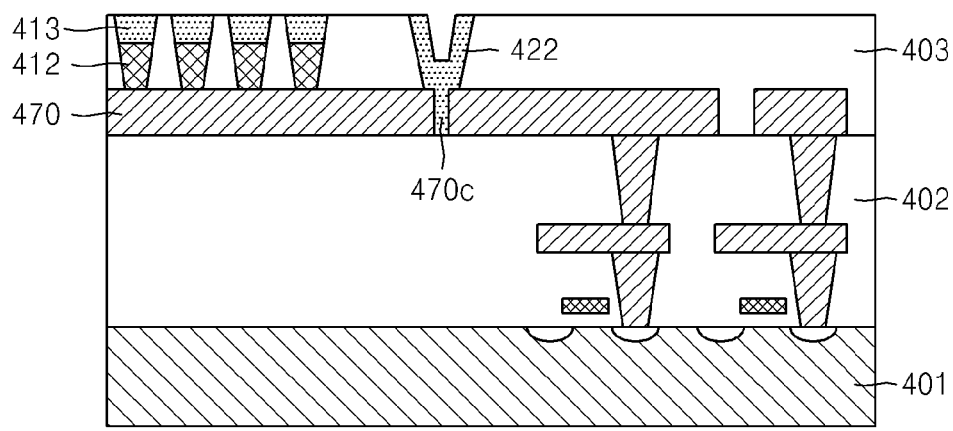

Referring to FIG. 9F, an upper surface of second interlayer insulating film 403 is exposed by performing a planarizing process or an etch-back process onto the variable resistance material VR. As a result, resistive memories that respectively include diode 412 and a first variable resistance material film 413 in first holes 411 are formed, and a resistor switch formed of a second variable resistance material film 422 that fills second hole 421 and intermediate region 470c of first conductive line 470 is formed.

According to another embodiment of the inventive concept, diodes 412 of the resistive memories and first variable resistance material film 413 may be formed as a multi-layer not as a single layer. For example, before and after depositing the variable resistance material VR in first and second holes 411 and 421, diode 412 may be formed by depositing an upper electrode, a middle electrode, and a lower electrode (not shown) only to first holes 411.

Figure 9G:
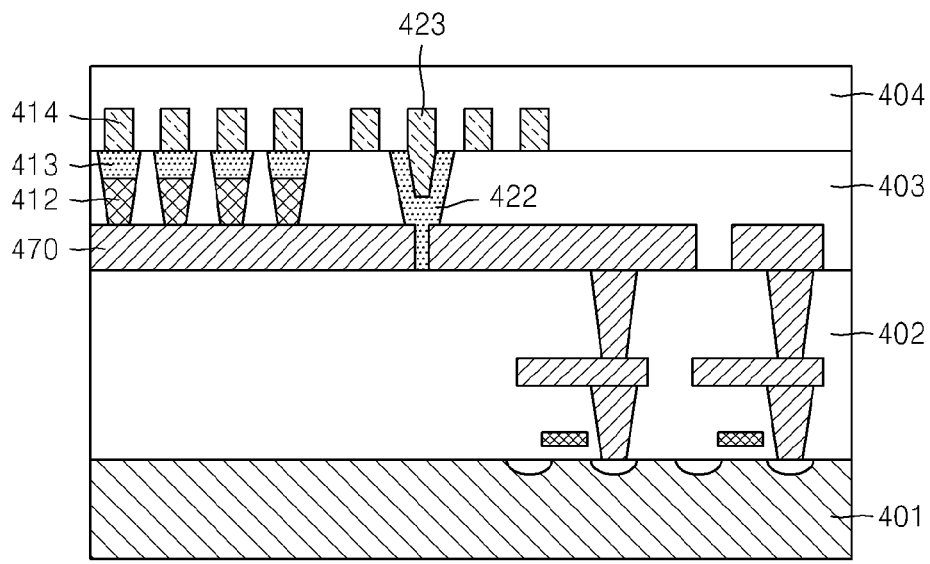

Referring to FIG. 9G, second conductive lines 414 and 423 are deposited on an upper surface of second interlayer insulating film 403. Second conductive lines 414 and 423 include second conductive lines 414 that operate as word lines by being disposed corresponding to the resistive memories and second conductive line 423 that is operated as a control line by being disposed corresponding to the resistor switch, and second conductive lines 414 and 423 may be disposed parallel to each other. Second conductive lines 414 and 423 may be formed by patterning a predetermined metal layer in a line shape. Second conductive lines 414 and 423 may be formed of a material having high conductivity, for example, one selected from the group consisting of W, Al, TiN, and Cu. Second conductive lines 414 and 423 may have widths equal to or different from each other. Afterwards, a third interlayer insulating film 404 having a height higher than or similar to that of second conductive lines 414 and 423 is formed.

Figure 9H:
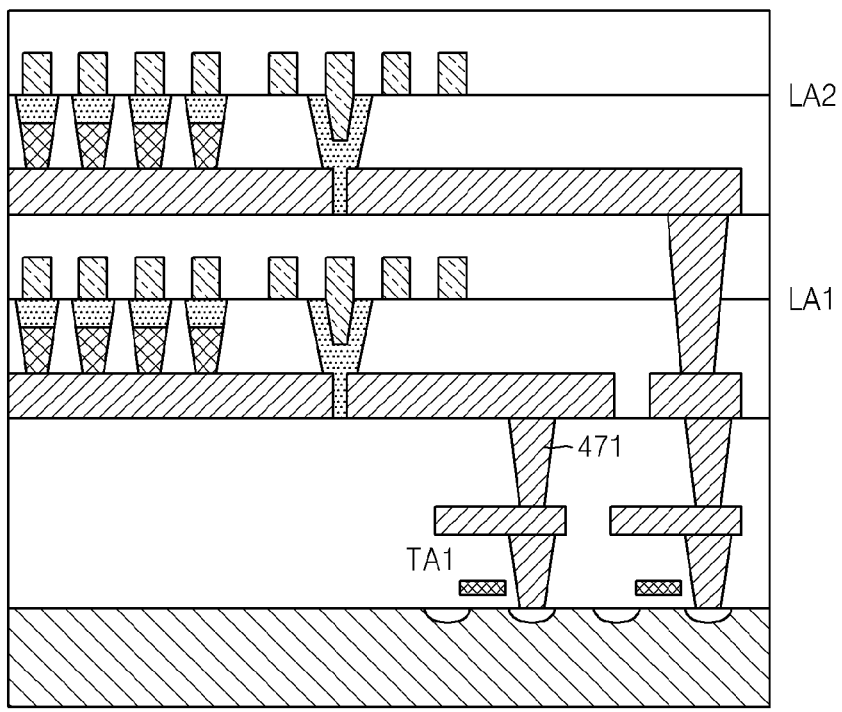

Referring to FIG. 9H, a plurality of layers (for example, second layer LA2) having the same structure as the first layer LA1 is vertically stacked. Also, contact plugs 471 are formed so that each of the layers LA1 and LA2 may contact the access transistors TA1 located on semiconductor substrate 401. For example, the first layer LA1 may be connected to the first access transistor TA1 through contact plug 471.

FIGS. 10A through 10F are cross-sectional views for explaining a method of manufacturing a semiconductor memory device 500 according to another embodiment of the inventive concept.

Figure 10A:
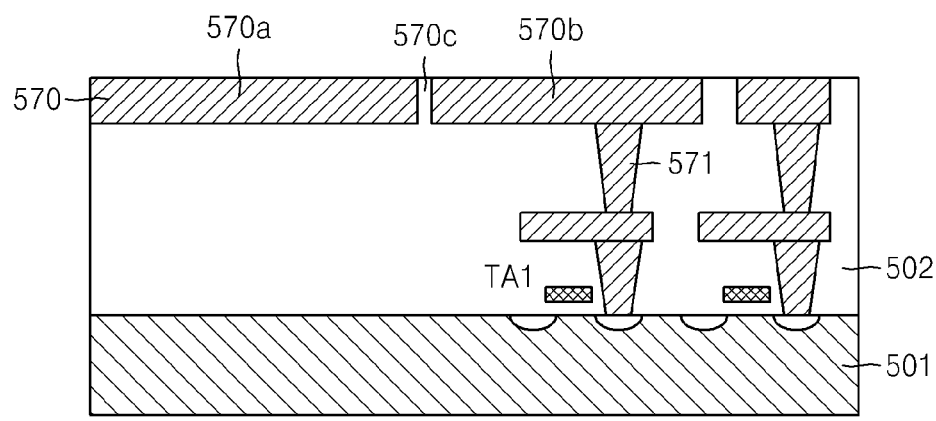
FIGS. 10A through 10F are cross-sectional views for explaining a method of manufacturing a semiconductor memory device according to another embodiment of the inventive concept.

Referring to FIG. 10A, a first interlayer insulating film 502 that includes a plurality of access transistors TA1 may be formed on a semiconductor substrate 501. The access transistors TA1 are connected to contact plugs 571. A first conductive line 570 that includes first line portion 570a and a second line portion 570b may be formed on first interlayer insulating film 502. First conductive line 570 may be formed of a material having a high conductivity, for example, one selected from the group consisting of W, Al, TiN, and Cu. First conductive line 570 may operate as a bit line of a resistive memory. Also, first line portion 570a and a second line portion 570b may be electrically separated from each other by forming an intermediate region 570c by patterning a portion of a section of first conductive line 570. Intermediate region 570c of first conductive line 570 may be buried by an insulating material.

Figure 10B:
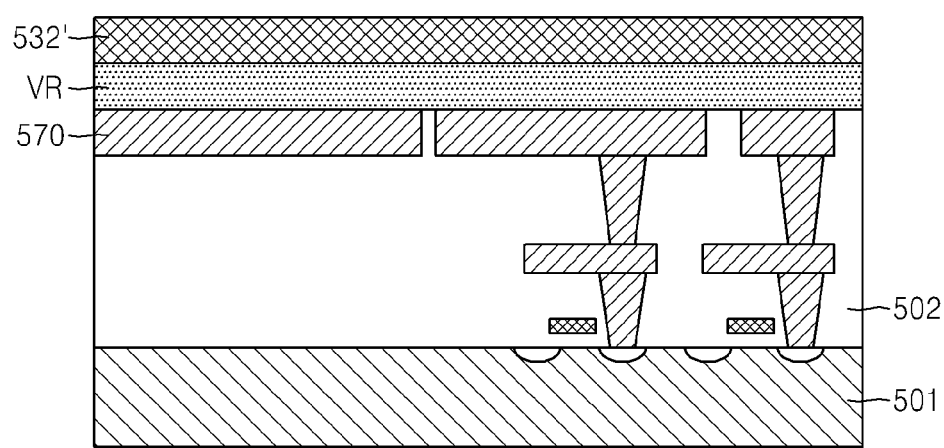

Referring to FIG. 10B, a variable resistance material VR may be formed on first conductive line 570 by an oxygen reactive sputtering process, a CVD process, or an ALD process. Also, a material film 532' for forming diodes 512 may be formed on the variable resistance material VR by using the above methods.

The variable resistance material VR may be a TMO, for example, one selected from the group consisting of $TiO_x$, $NiO_x$, $TaO_x$, $WO_x$, $HfO_x$, $A_xO_x$, $SrTiO_x$, $Zr_x$, $ZnO_x$, and a composite of these metal oxides. Also, the variable resistance material VR may be a solid-electrolyte, for example, $Ag_2S$, $Cu_2S$, or a chalcogenide group compound, or a material that allows variable switching of resistance, such as a perovskite group compound. In order to realize a high volatility memory device, the variable resistance material VR may be a material having a large ratio between a resistance value at a low resistance state and a resistance value at a high resistance state and having a low driving voltage to reduce power consumption.

Materials film 532' for forming diodes 512 in which p-type oxide layers and n-type oxide layers are sequentially stacked or p-type silicon layers and n-type silicon layers are sequentially stacked. For example, diodes 512 may have a stacking structure in which p-type layers such as CuO layers and n-type layers such as InZnO layers are sequentially stacked.

Figure 10C:
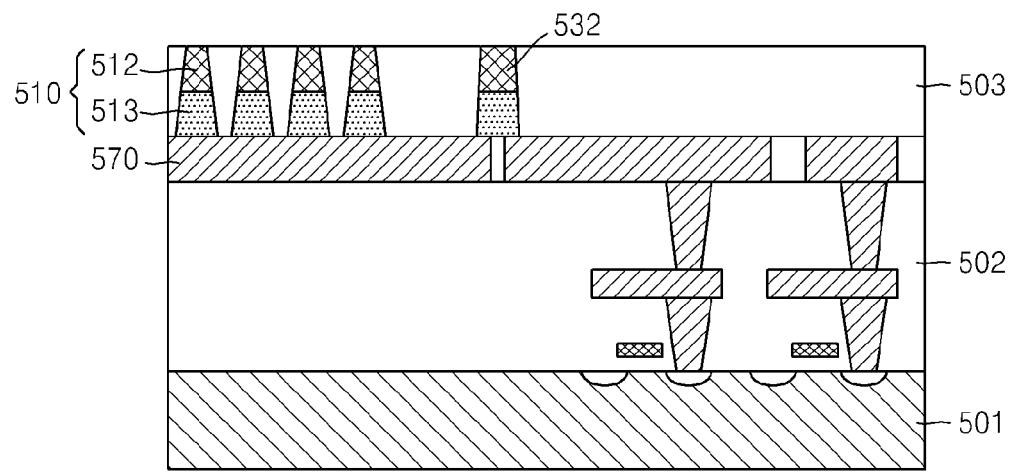

Referring to FIG. 10C, a plurality of stack structures 510, a width of which is gradually increased from top to bottom is formed by patterning the deposited variable resistance material VR and material film 532' (refer to FIG. 10B). At this point, a portion of an upper surface of first conductive line 570 is exposed. Afterwards, a second interlayer insulating film 503 having a height as the same as that of stack structures 510 is formed.

Figure 10D:
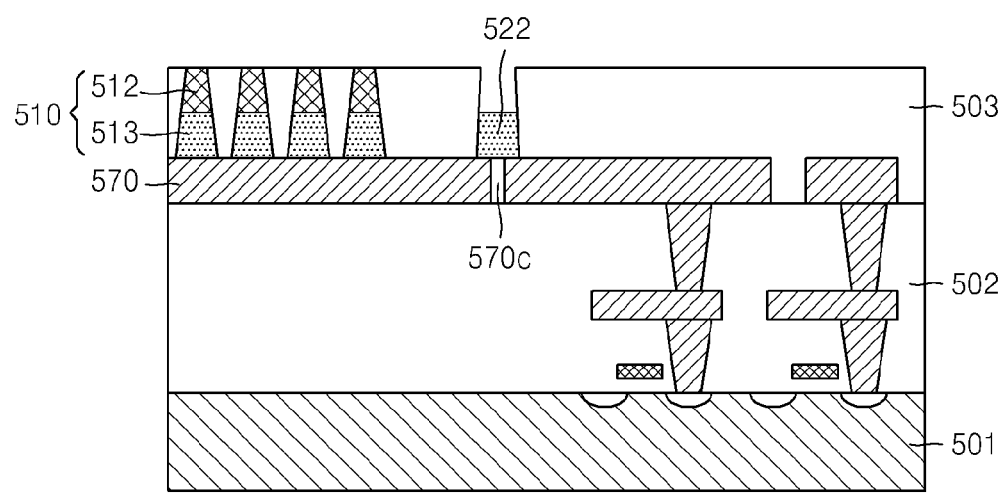
Figure 10E:
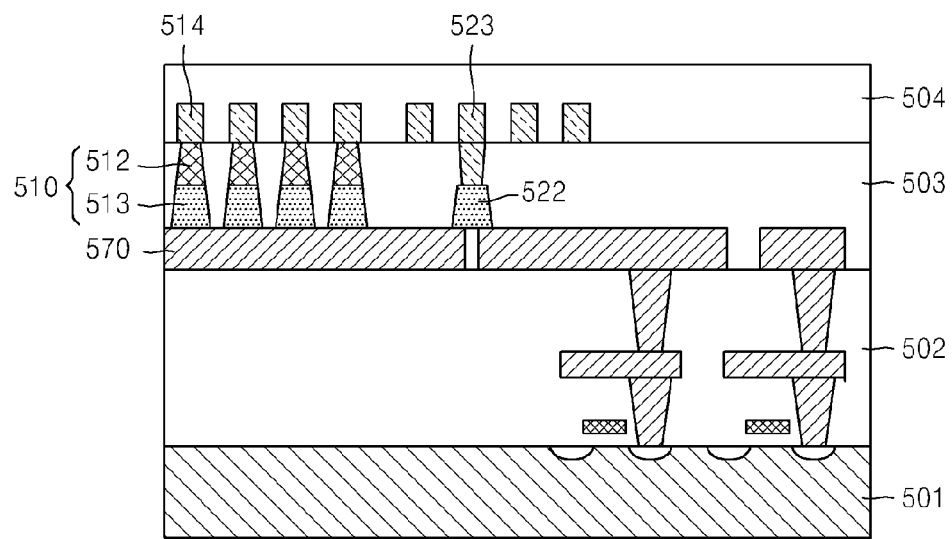

Referring to FIG. 10D, upper layer 532 (refer to FIG. 10C) of stack structure 510 located on intermediate region 570c of first conductive line 570 in second interlayer insulating film 503 is removed by etching using a photoresist PR. Referring to FIG. 10E, second conductive lines 514 and 523 are deposited on an upper surface of second interlayer insulating film 503. Second conductive lines 514 and 523 may be wires parallel to each other. Second conductive lines 514 and 523 may be formed by patterning a predetermined metal layer in a line shape. Also, second conductive lines 514 and 523 may be formed of a material having a high conductivity, for example, one selected from the group consisting of W, Al, TiN, and Cu. Some 514 of second conductive lines 514 and 523 may be positioned on a first variable resistance material film 513 that constitute resistive memories, and may be operated as word lines of memories. The rest of second conductive lines 514 and 523 may be disposed on a second variable resistance material film 522, and may operate as gates of resistor switches. A third interlayer insulating film 504 having a height higher than or similar to that of second conductive lines 514 and 523 may be formed.

Figure 10F:
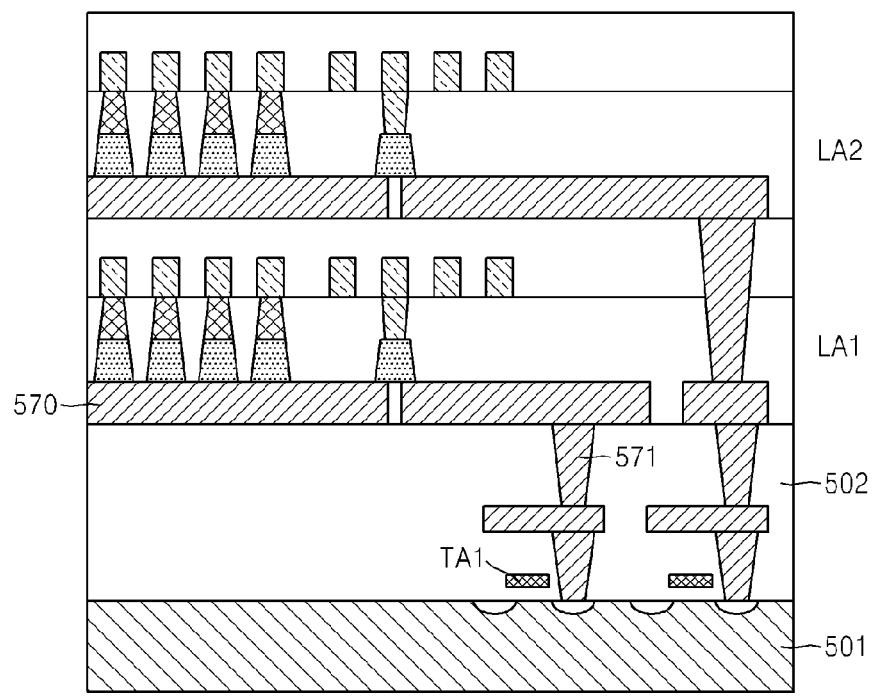

Referring to FIG. 10F, a plurality of layers (for example, second layer LA2) having the same structure as the first layer LA1 is vertically stacked. Also, contact plugs 571 are formed so that each of the layers LA1 and LA2 may contact the access transistors TA1 located on semiconductor substrate 401. For example, the first layer LA1 may be connected to the first access transistor TA1 through contact plug 571.

Figure 11:
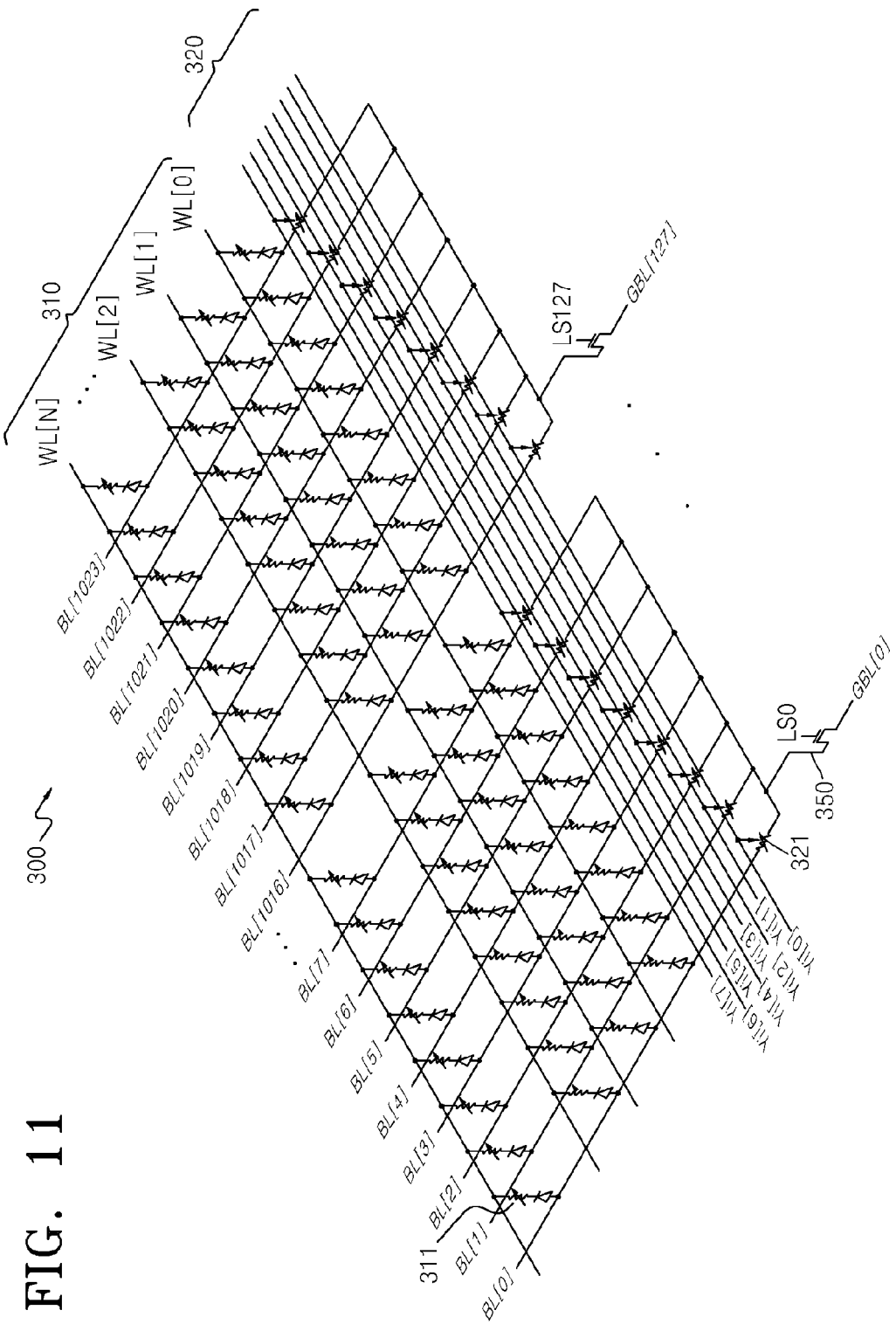
FIG. 11 is a circuit diagram of a modified version of the structure of the semiconductor memory device of FIG. 5.

FIG. 11 is a circuit diagram of a modified version of the structure of the semiconductor memory device of FIG. 5. For convenience of explanation, in FIG. 11, one semiconductor layer of a plurality of semiconductor layers included in semiconductor memory device 300 is depicted. The semiconductor layer may include memory cell region 310 and logic region 320. Memory cell region 310 may include word lines WL, bit lines BL, and memory cells 311 disposed at each crossing point of the word lines and the bit lines.

Logic region 320 may include a column decoder. The column decoder may include resistor switches that are switched in response to control signals Yi[0] through Yi[7], and the control signals Yi[0] through Yi[7] may be generated by decoding an external address in logic region 320. The selection of the bit lines BL is controlled based on a switching operation of resistor switches 321. In FIG. 11, as an example, 1024 bit lines BL are disposed in a single layer, 8 bit lines are grouped, and the 8 bit lines BL respectively are controlled by the control signals Yi[0] through Yi[7]. Lines that transmit the control signals Yi[0] through Yi[7] are disposed perpendicularly crossing the bit lines BL. The 8 bit lines BL (for example, BL[0] through BL[7]) that belong to one group are commonly connected to one data line 350 formed through contact plugs (or via contacts), and data line 350 is connected to a global bit line GBL of a control region (not shown) disposed on the substrate. In the case of the semiconductor layer of FIG. 11, the disposition of 128 groups is explained as an example, and thus, 128 data lines 350 corresponding to the number of the 128 groups are disposed, and also, the 128 data lines 350 respectively are connected to 128 global bit lines GBL[0] through GBL[127]. Data lines 350 may be connected to the global bit lines GBL[0] through GBL[127] to be able to be switched. Another control signals LS[0] through LS[127] depicted in FIG. 11 are signals for controlling the connection between data lines 350 and the global bit lines GBL[0] through GBL[127].

Since logic region 320 includes the column decoder, the number of data lines 350 vertically disposed to connect the layers and a substrate (not shown) may be reduced. For example, the column decoder is disposed in control region 340 of the substrate, and the number of bit lines disposed on each of the layers is a, the same number (a) of global conductive lines corresponding to each of the layer are needed. However, as shown in FIG. 11, when some of logic circuits (for example, the column decoder) in control region 340 of the substrate are disposed on each of the layers, and eight bit lines are defined as one group, even though the global conductive lines for transmitting a column address, the number of the global conductive lines (data lines) disposed corresponding to the bit lines of each of the layers may be reduced to a/8, thereby reducing the total number of global conductive lines.

Figure 12:
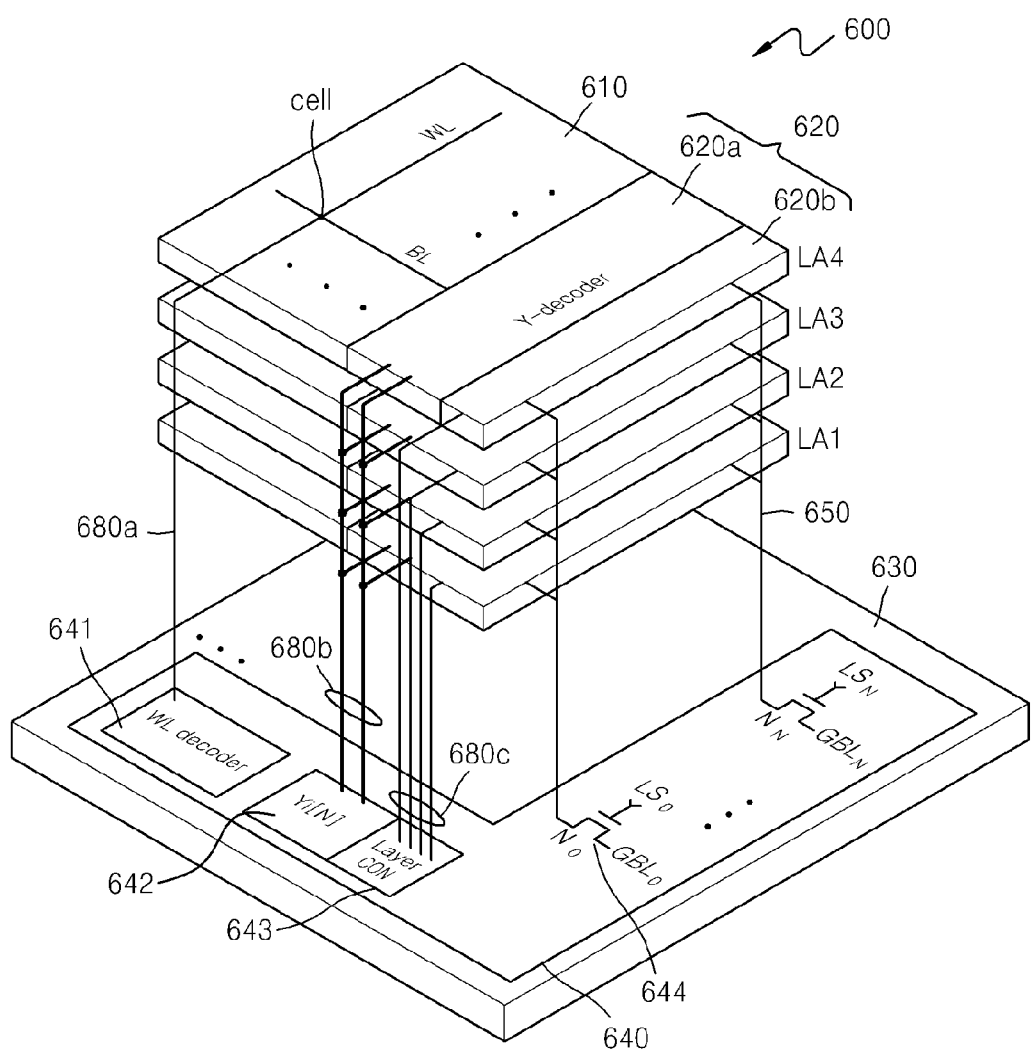
FIG. 12 is a block diagram showing a three dimensionally realized a semiconductor memory device according to another embodiment of the inventive concept.

FIG. 12 is a block diagram showing a three dimensionally realized semiconductor memory device 600 according to another embodiment of the inventive concept. Referring to FIG. 12, semiconductor memory device 600 may include a substrate 630 and a plurality of semiconductor layers LA1 through LA4 that are vertically stacked. In FIG. 12, four semiconductor layers LA1 through LA4 stacked on substrate 630 are depicted as an example, but different number of semiconductor layers may be stacked. The semiconductor layers LA1 through LA4 respectively may include a memory cell region 610 and a logic region 620. Memory cell region 610 may include word lines WL, bit lines BL, and memory cells disposed on each crossing point of the word lines and the bit lines. The memory cell may be a resistive memory that includes a variable resistance device and a diode.

Logic region 620 may include a column decoder 620a and a layer selection region 620b. Since data lines 650 for vertically transmitting data between the semiconductor layers LA1 through LA4 and substrate 630 are shared with the semiconductor layers LA1 through LA4, layer selection regions 620b for selecting layers are respectively disposed in each of the semiconductor layers LA1 through LA4 to control the selection of the layers.

A control region 640 for controlling operations of the memories of the semiconductor layers LA1 through LA4 is disposed on substrate 630. Control region 640 may include a row decoder 641 that controls the selection of word lines WL for the semiconductor layers LA1 through LA4, an address buffer 642 for providing a column address to the semiconductor layers LA1 through LA4, a layer selection control unit 643 that generates layer selection signals for controlling the selection of the semiconductor layers LA1 through LA4, and a switching circuit 644 that controls electrical connection between the bit lines BL of the semiconductor layers LA1 through LA4 and the global bit lines GBL on substrate 630. Control region 640 provides an interface for memory cell region 610 and logic region 620 of each of the semiconductor layers LA1 through LA4 to communicate with external signals, and is electrically connected to the semiconductor layers LA1 through LA4 through global conductive lines 650, 680a, 680b, and 680c.

Column decoder 620a and layer selection region 620b respectively may include a resistor switch (not shown). In FIG. 12, as an example, data lines 650 for transmitting data between the semiconductor layers LA1 through LA4 and substrate 630 are commonly disposed to the semiconductor layers LA1 through LA4. In this case, the resistor switches (not shown) included in each of layer selection regions 620b for preventing data collision between the semiconductor layers LA1 through LA4 are switched in response to a control signal transmitted from layer selection control unit 643. Since the semiconductor layers LA1 through LA4 are sequentially selected, the semiconductor layers LA1 through LA4 may transmit data to substrate 630 through common data lines 650.

Figure 13:
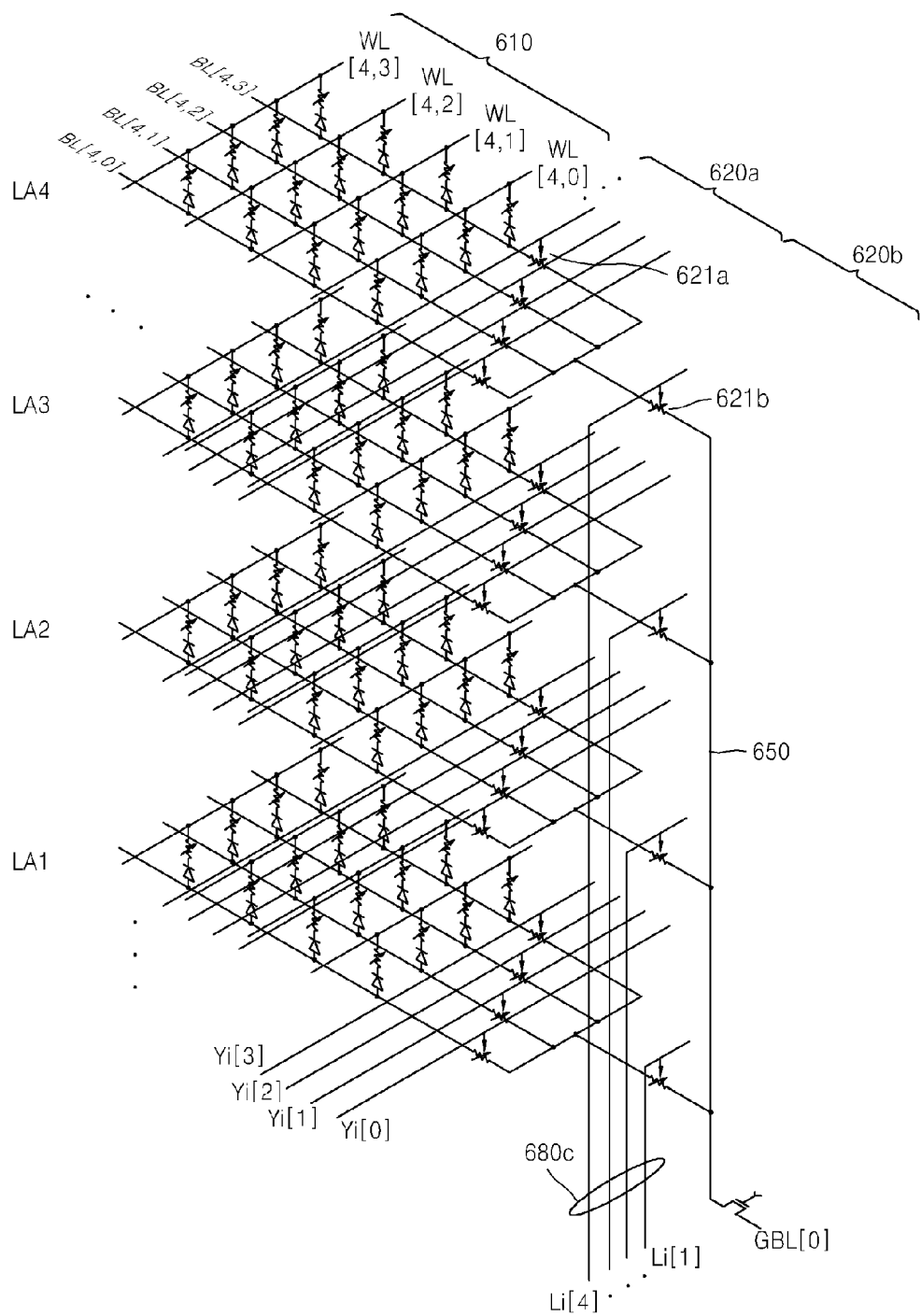
FIG. 13 is a circuit diagram showing an example of the three dimensionally realized semiconductor memory device of FIG. 12.

FIG. 13 is a circuit diagram showing an example of the three dimensionally realized semiconductor memory device of FIG. 12. Semiconductor memory device 600 may include may include a substrate 630 and a plurality of semiconductor layers LA1 through LA4 three dimensionally stacked on the substrate. The semiconductor layers LA1 through LA4 respectively may include a memory cell region 610 and logic regions 620a and 620b.

In FIG. 13, four bit lines of each of the semiconductor layers LA1 through LA4 are defined as one group, and the one group of bit lines is connected to data line 650 as a single global conductive line. Logic regions 620a and 620b of the semiconductor layers LA1 through LA4 respectively include column decoder 620a and layer selection region 620b, and column decoder 620a and layer selection region 620b respectively include at least one resistor switch 621a and 621b. Resistor switch 621a of column decoder 620a may be controlled in response to one of column selection signals Yi[0] through Yi[3] generated from a decoding circuit (not shown) that may be disposed in column decoder 620a, and also, the resistor switch 621b of layer selection region 620b may be controlled in response to one of layer selection control signals Li[0] through Li[3] transmitted from a control region (not shown) located on substrate 630 through the global conductive lines. When a layer and a bit line is selected by the process described above, data of the bit line corresponding to the selected layer is transmitted to the global bit line GBL[0] located on substrate 630 through data line 650.

Figure 14:
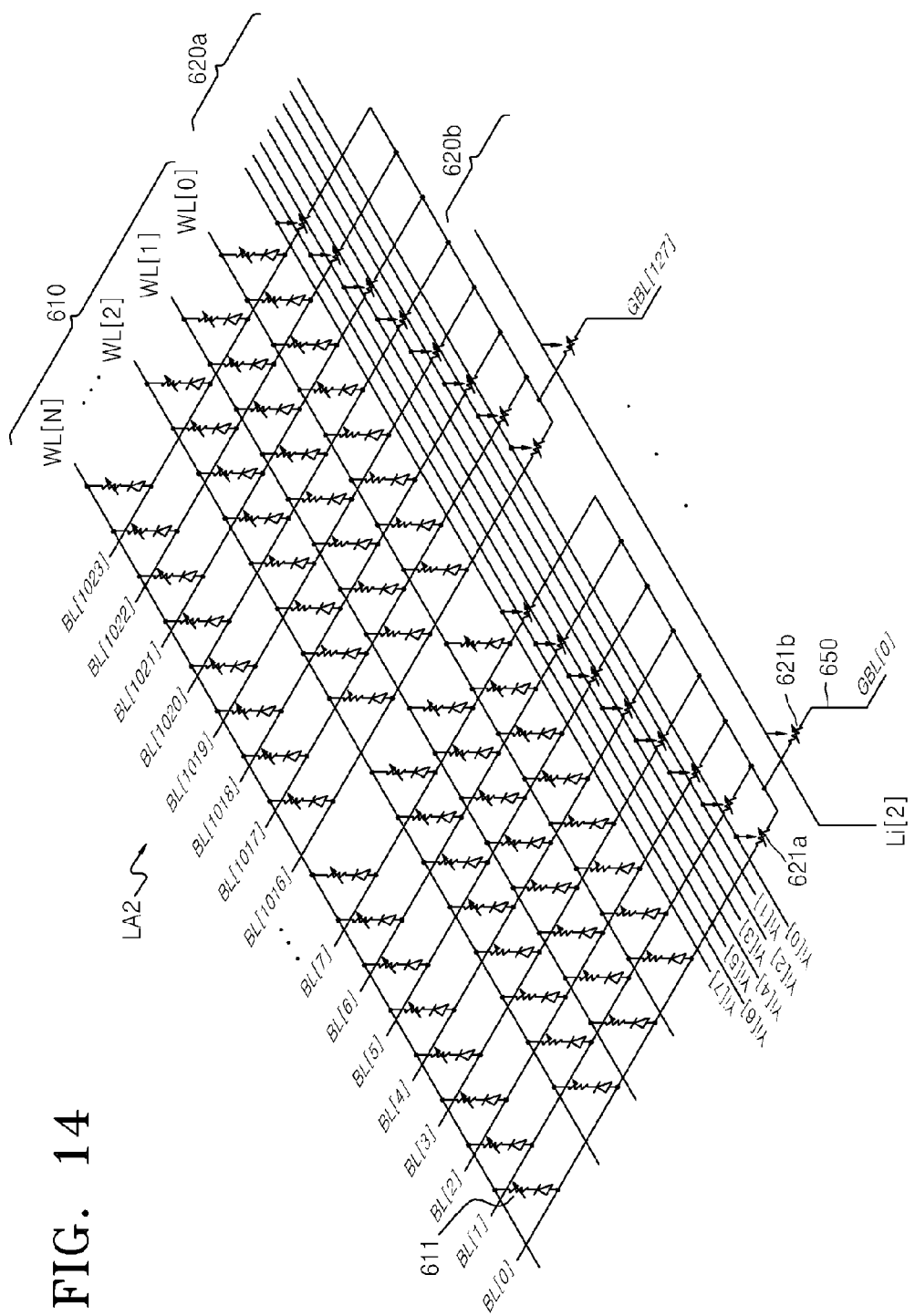
FIG. 14 is a circuit diagram showing another example of the three dimensionally realized semiconductor memory device of FIG. 12.

FIG. 14 is a circuit diagram showing another example of three dimensionally realized semiconductor memory device 600 of FIG. 12. For convenience of explanation, in FIG. 14, only one semiconductor layer (the second layer LA2) is depicted. The layer LA2 may include memory cell region 610 and logic regions 620a and 620b, and logic regions 620a and 620b may include a column decoder 620a and a layer selection region 620b for selecting a layer. Memory cell region 610 may include word lines WL, bit lines BL, and memory cells 611 respectively disposed at each crossing point of the word lines WL and the bit lines BL.

In FIG. 14, as an example, 1024 bit lines BL[0] through BL[1023] are disposed in the layer LA2 and 8 bit lines BL are defined to a group, and thus, total 128 groups are formed. One data line 650 that vertically transmits data is disposed corresponding to each of the groups, and the connection between the bit lines BL[0] through BL[1023] and data line 650 is controlled by layer selection switch 621b realized as a resistor switch. When layer selection switch 621b for selecting the layer LA1 is turned on, the bit lines BL[0] through BL[1023] are connected to global bit lines GBL[0] through GBL[127] in a control region (not shown) located on substrate 630 through data line 650.

Figure 15:
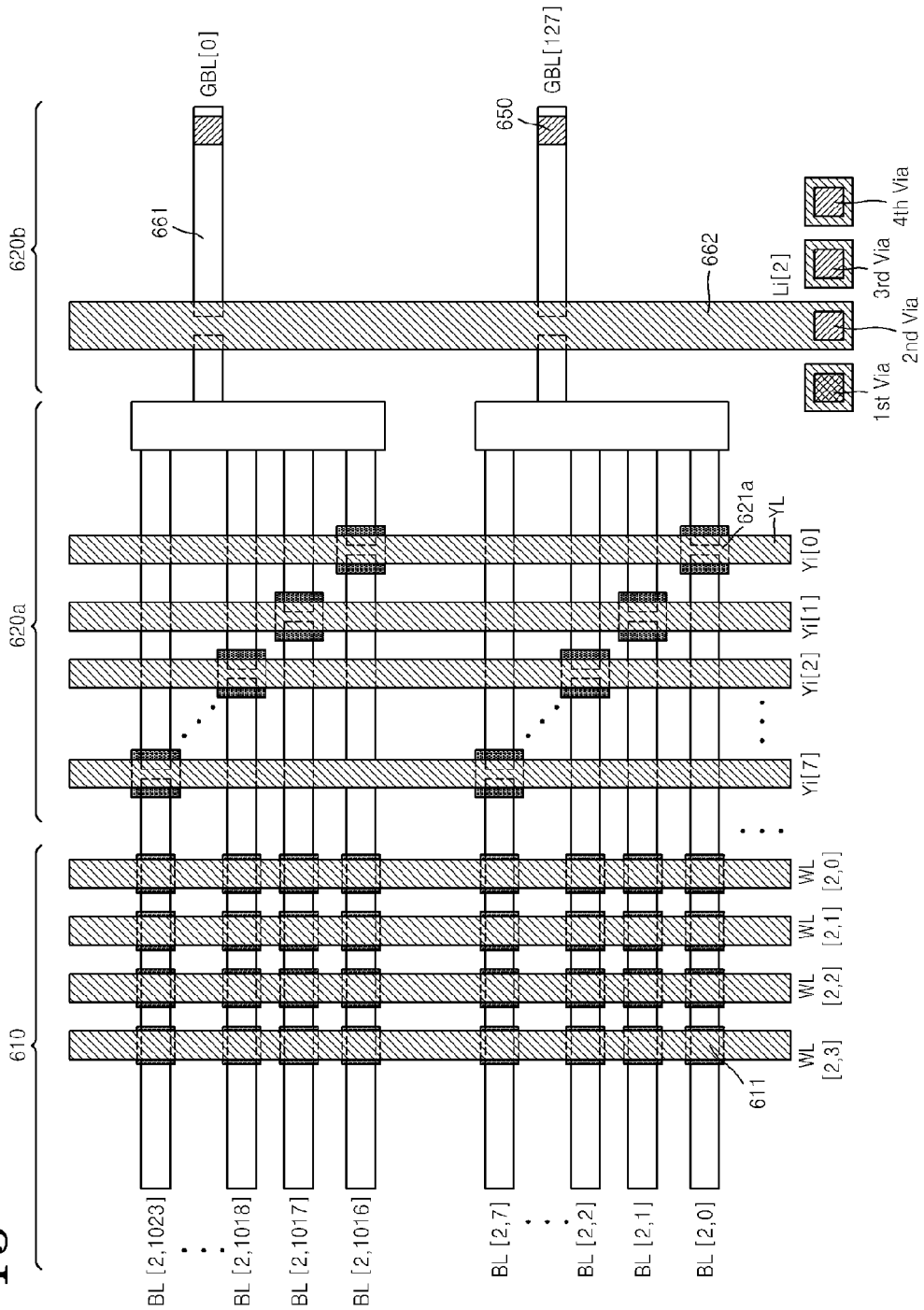
FIG. 15 is a plan view of a layout of the semiconductor memory device of FIG. 14.

FIG. 15 is a plan view of a layout of the circuit of FIG. 14. The layout in FIG. 14 is a portion of the layer LA2 of semiconductor memory device 600. The layout may be divided into memory cell region 610, column decoder 620a, and layer selection region 620b.

Bit lines BL and word lines WL that perpendicularly cross each other are disposed in memory cell region 610. Resistive devices are positioned at each of the crossing points of the bit lines BL and the word lines WL, and the resistive devices constitute resistive memories 611. The bit lines BL extend to the column decoder 620a, and patterned sections are formed on extended lines of the bit lines BL in the region of column decoder 620a. First resistor switches 621a are disposed corresponding to the patterned section. Lines YL that transmit control signals Yi[0] through Yi[7] for controlling first resistor switches 621a are perpendicularly disposed with respect to the bit lines BL, and first resistor switches 621a are positioned at points where the patterned section of the bit lines BL and the lines YL that transmit the control signals Yi[0] through Yi[7] cross each other. The plural bit lines BL are defined as one group, for example, the 8 bit lines BL[2,0]~BL[2,7] are connected to one global bit line GBL[0] in a control region (not shown) through data lines 650 as a common global conductive line.

In layer selection region 620b, a common bit line 661 that is commonly connected to 8 bit lines BL and a layer signal line 662 are perpendicularly crossing each other, and second resistor switches 621b are disposed at the crossing points between common bit line 661 and layer signal line 662. Common bit line 661 is connected to data line 650 that transmits data from the layer LA2 to a substrate (not shown), and layer signal line 662 receives a layer control signal Li[2] from the substrate (not shown). Accordingly, in a three dimensional memory device in which a plurality of layers are stacked, even though a data line 650 is shared, data collision may be prevented by controlling the selection of layers by selectively turning on and off second resistor switches 621b.

Figure 16A:
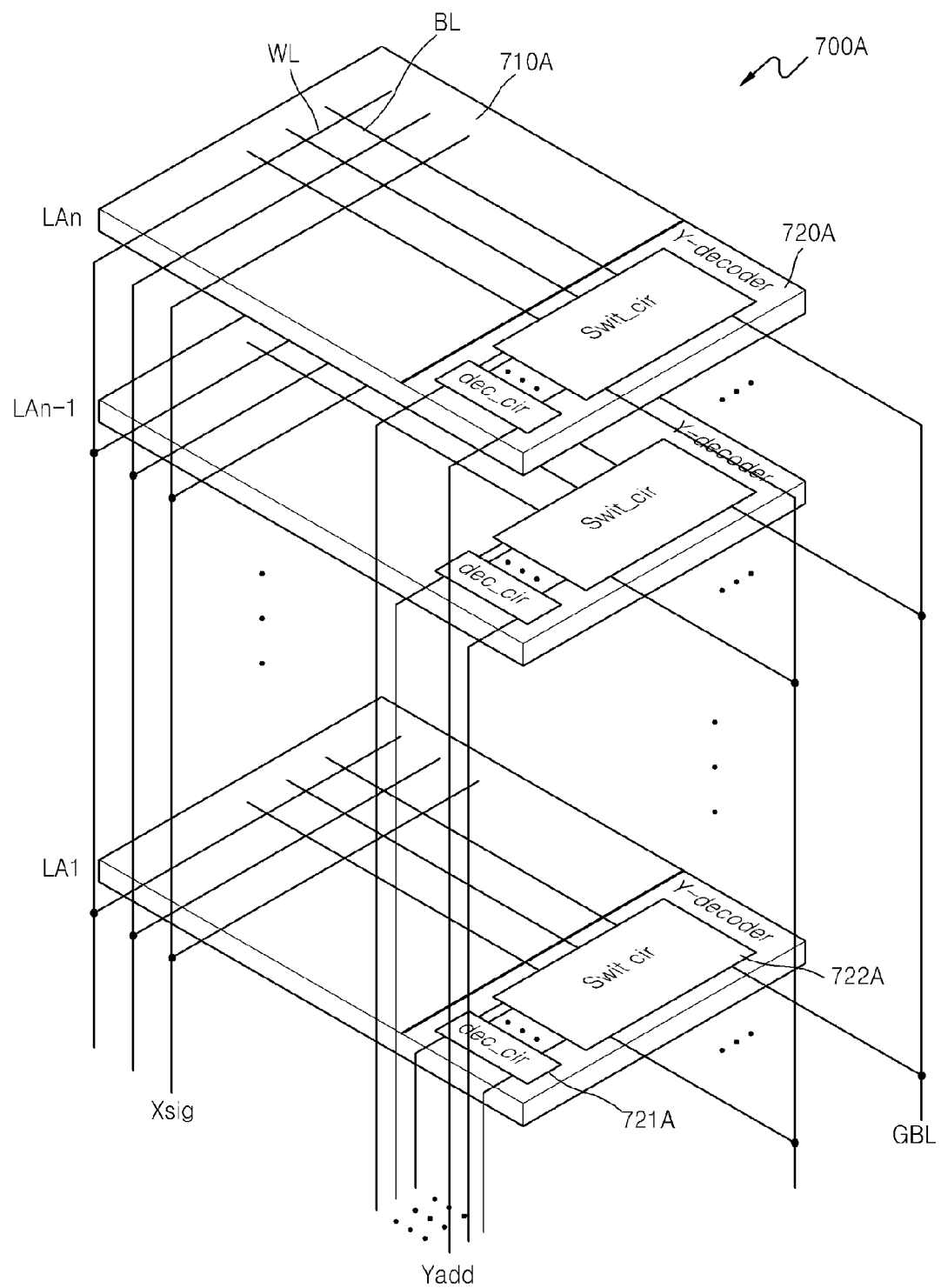
FIGS. 16A and 16B are block diagrams showing semiconductor memory devices having a three dimensional stacking structure according to another embodiment of the inventive concept.
Figure 16B:
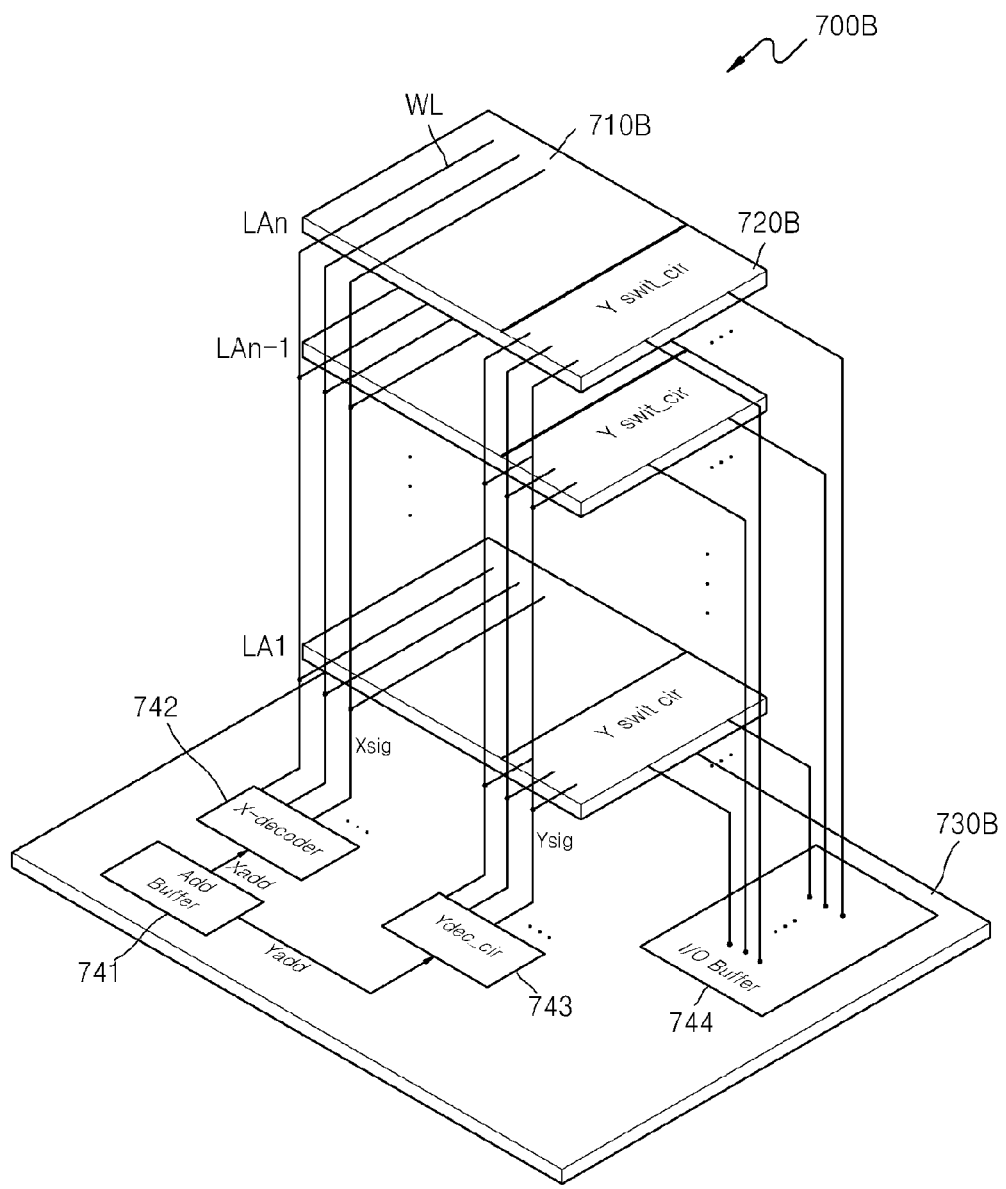

FIGS. 16A and 16B are block diagrams showing semiconductor memory devices 700 having a three dimensional stacking structure according to another embodiment of the inventive concept. In FIG. 16A, as an example, it is depicted that column decoders respectively are disposed in each of logic regions 720A of the semiconductor layers LA1 through LAn which are stacked above a semiconductor substrate, and global conductive lines that supply a column address to the column decoders are disposed separately on each of the semiconductor layers LA1 through LAn.

As shown in FIG. 16A, semiconductor memory device 700A may include a plurality of semiconductor layers LA1 through LAn stacked on a semiconductor substrate. For convenience of explanation, the description of the semiconductor substrate is not repeated since the semiconductor substrate according to the current embodiment is the same as or similar to the semiconductor substrate previously described. Also, each logic region 720A of the semiconductor layers LA1 through LAn may include a column decoder, and the column decoder may include a decoding circuit 721A that decodes a column address Yadd and a switching circuit 722A that controls the selection of data in a memory cell region 710A according to the decoding result.

A word line signal Xsig is supplied from the substrate (not shown) to each of the word lines WL of the semiconductor layers LA1 through LAn through global conductive lines (for example, global word lines). One word line WL of the word lines WL is selected in response to the word line signal Xsig. The global word lines that transmit the word line signal Xsig are shared with the semiconductor layers LA1 through LAn, the word lines WL disposed in the same positions of the semiconductor layers LA1 through LAn may be commonly selected. However, since the global conductive lines (for example, global column address lines) that supply a column address Yadd to the column decoder are separately disposed, one bit line BL of a single layer is selected, and thus, data of the selected bit line BL may be transmitted to the global bit lines GBL located on the substrate through the global conductive lines.

In semiconductor memory device 700B of FIG. 16B, as an example, it is depicted that the total circuits included in the column decoder are not disposed in a logic region 720b of the semiconductor layers LA1 through LAn, but some of the circuits of the column decoder are disposed in logic region 720b. The column decoder may include a decoding circuit 743 that decodes the column address Yadd and switching circuits that control the selection of bit line BL in response to a bit line driving signal Ysig according to the decoding result. In FIG. 16B, as an example, it is depicted that decoding circuit 743 is disposed on a substrate 730B, and the switching circuits are disposed in logic region 720b of each of the semiconductor layers LA1 through LAn.

Substrate 730B may include an address buffer 741, a row decoder 742, a column decoding circuit 743, and an input/output buffer 744, and the logic circuits disposed on substrate 730B may be CMOS based circuits. Row decoder 742 and column decoding circuit 743 respectively generate a word line driving signal Xsig and a bit line driving signal Ysig by decoding a row address Xadd and a column address Yadd. Also, the word line driving signal Xsig and the bit line driving signal Ysig are supplied to the layers LA1 through LAn. A switching circuit based on a resistance switch is disposed in logic region 720, and the switching of the switching circuit is controlled in response to the bit line driving signal Ysig. Data of each of the semiconductor layers LA1 through LAn is transmitted to input/output buffer 744 of substrate 730B based on the switching operation of the switching circuit.

Figure 17A:
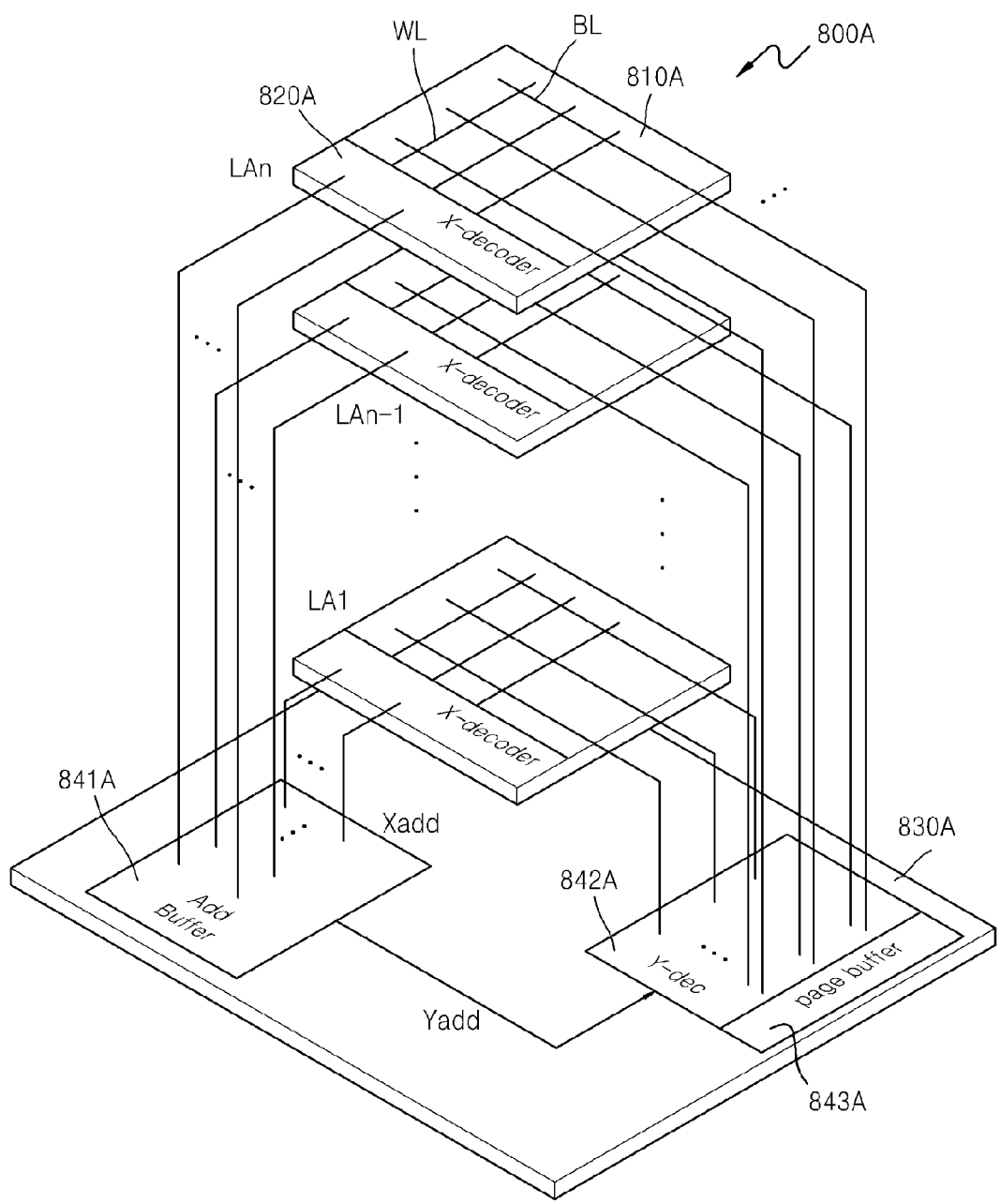
FIGS. 17A through 17D are block diagrams of semiconductor memory devices having a three dimensional stacking structure according to another embodiment of the inventive concept.

FIGS. 17A through 17D are block diagrams showing semiconductor memory devices having a three dimensional stacking structure according to another embodiment of the inventive concept. In FIG. 17A, it is depicted that low decoders are disposed in a logic region 820A of each of the semiconductor layers LA1 through LAn.

As shown in FIG. 17A, semiconductor memory device 800A may include a semiconductor substrate 830A and a plurality of semiconductor layers LA1 through LAn stacked above semiconductor substrate 830A. The semiconductor layers LA1 through LAn respectively may include a memory cell region 810A and a logic region 820A, and logic region 820A may include a row decoder X-decoder based on a resistor switch. Also, semiconductor substrate 830A may include logic circuits for supporting memory operation, for example, an address buffer 841A, a column decoder 820A, and a buffer (for example, a page buffer) 843A that stores data in a predetermined unit.

Address buffer 841A supplies a row address Xadd and a column address Yadd respectively to a row decoder X-decoder and a column decoder 842A. Since the row decoder is disposed in logic region 820 of each of the semiconductor layers LA1 through LAn, the row address Xadd is supplied to a row decoder of each of the semiconductor layers LA1 through LAn through global word lines. In FIG. 17A, the global word lines for transmitting the row address Xadd to the row decoders are separately disposed in each of the semiconductor layers LA1 through LAn. However, the global word lines may be commonly disposed in the semiconductor layers LA1 through LAn. Also, the selection of bit line in the memory cell region 810A is controlled by the operation of column decoder 842A, and through the operation described above, data is transmitted from the semiconductor layers LA1 through LAn to page buffer 843A.

Figure 17B:
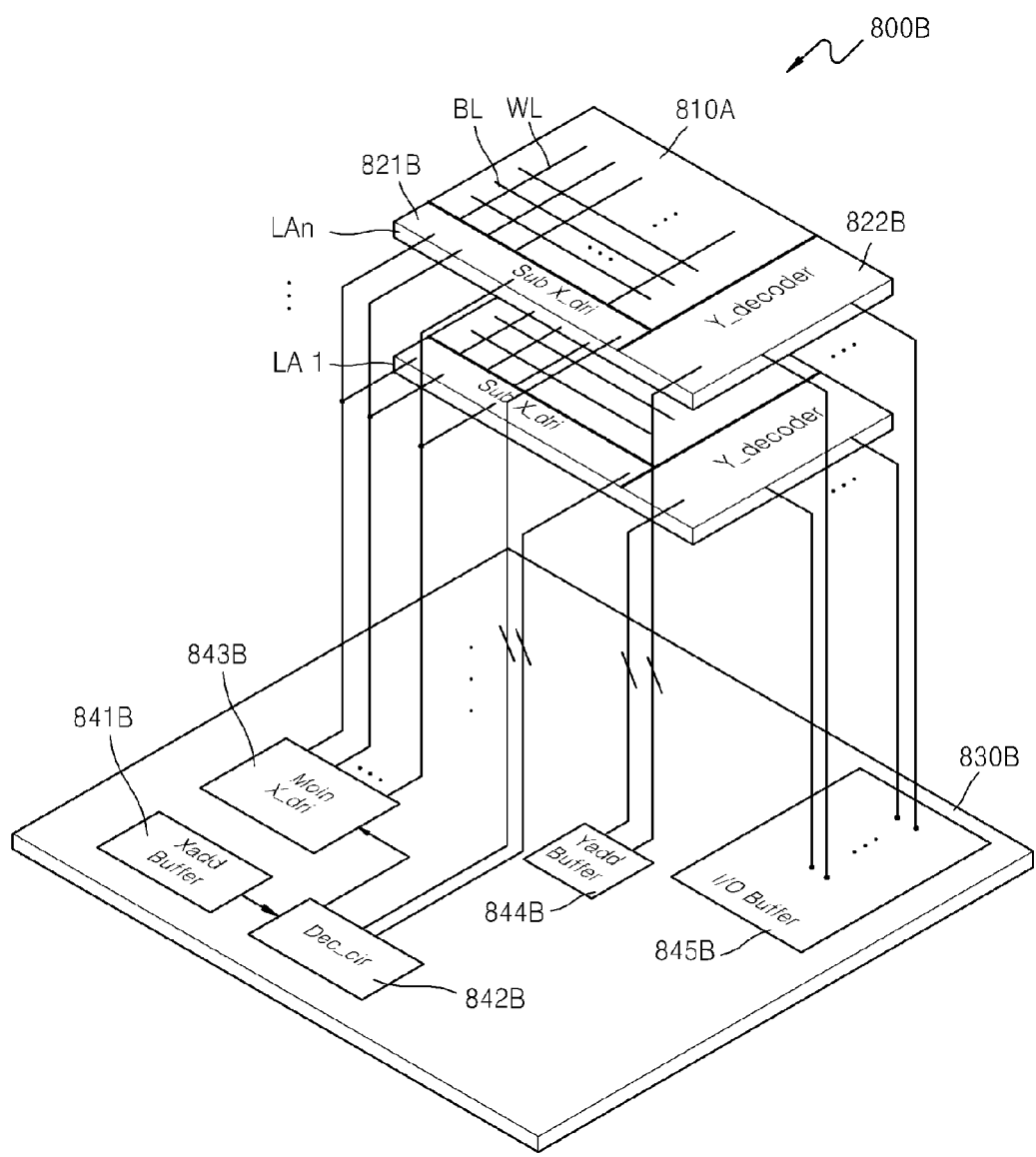

In FIG. 17B, it is depicted that the row decoder is disposed on each of the semiconductor layers LA1 through LAn. The row decoder may include a main word line driving unit MainX_dri 843B for driving main word lines and a sub-word line driving unit SubX_dri 821B for driving sub-word lines, and the sub-word line driving unit SubX_dri 821B is connected to word lines to practically access to memory cells. In FIG. 17B, a main word driving unit 843B is disposed on a semiconductor substrate 830B, and logic regions of the semiconductor layers LA1 through LAn include a sub-word line driving unit 821B and a column decoder 822B. Semiconductor substrate 830B may include a row address buffer 841B, a decoding circuit 842B, a column address buffer 844B, and an input/output buffer 845B in addition to main word line driving unit 843B.

Decoding circuit 842B decodes a row address, and supplies the decoding result to main word line driving unit 843B and sub-word line driving unit 821B. The decoding result is supplied to main word line driving unit 843B through a conductive line on semiconductor substrate 830B, and also, is supplied to sub-word line driving unit 821B through a global conductive line. Sub-word line driving unit 821B of each of the semiconductor layers LA1 through LAn generates a driving signal for accessing to word line WL in response to a driving signal from main word line driving unit 843B and the decoding signal from decoding circuit 842B. In FIG. 17B, a driving signal from main word line driving unit 843B is supplied to the semiconductor layers LA1 through LAn through the common global conductive lines, and a decoding signal from decoding circuit 842B is supplied to the semiconductor layers LA1 through LAn through global conductive lines of separated structure. However, the structure of the global conductive lines may be modified in various forms based on the descriptions of the previous embodiments of the inventive concept.

Figure 17C:
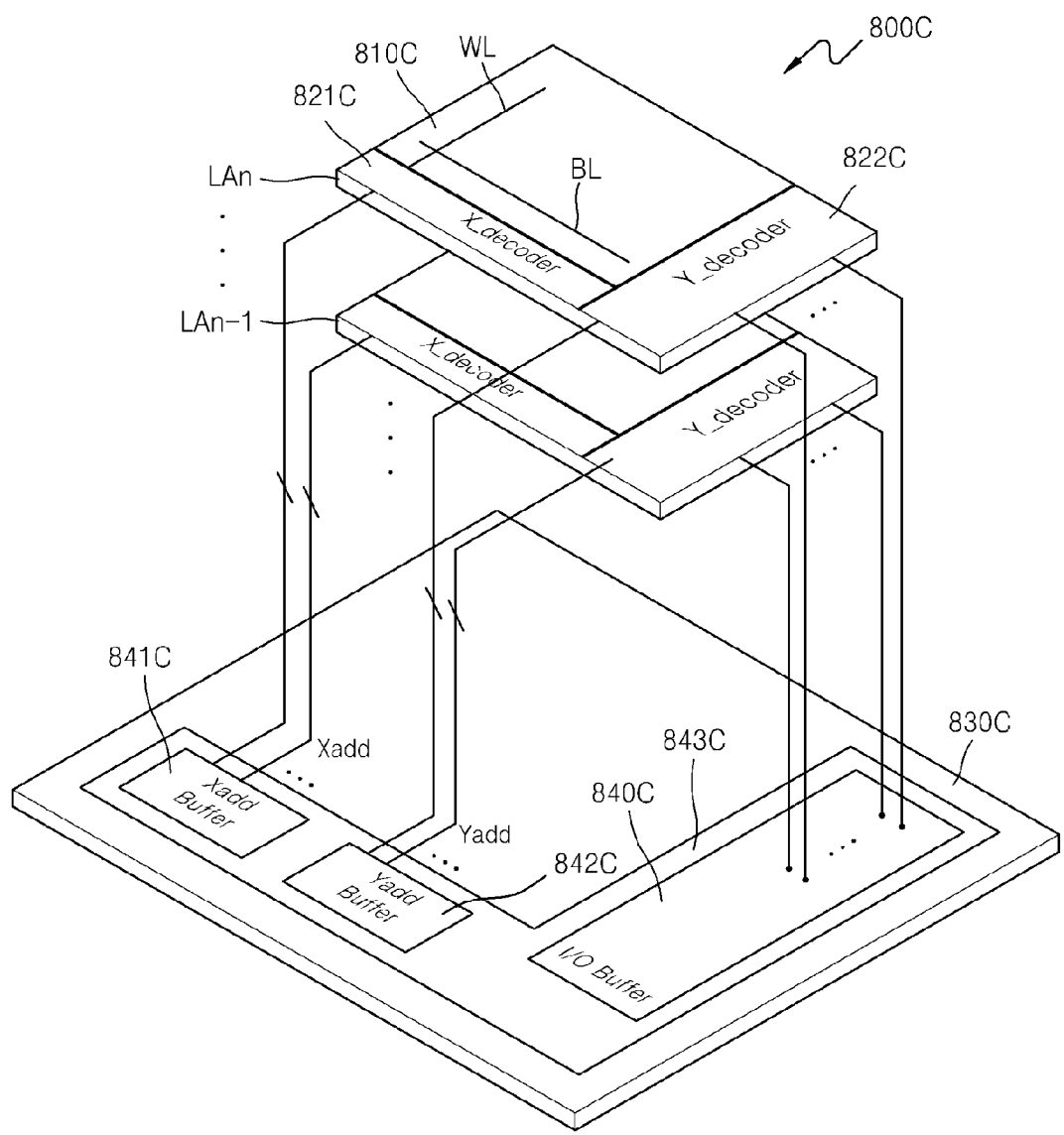

In a semiconductor memory device 800C of FIG. 17C, both a row decoder X-decoder and a column decoder Y-decoder are disposed on each of the semiconductor layers LA1 through LAn. As depicted in FIG. 17C, semiconductor memory device 800C may include a semiconductor substrate 830C and a plurality of semiconductor layers LA1 through LAn stacked above semiconductor substrate 830C. The semiconductor layers LA1 through LAn respectively may include a memory cell region 810C and a logic region, and logic region may include a row decoder 821C based on a resistor switch and a column decoder 822C. Semiconductor substrate 830C may include various logic circuits for supporting the operation of semiconductor memory device 800C, for example, a row address buffer 841C, a column address buffer 842C, and an input/output buffer 843C.

Row address buffer 841C supplies a row address Xadd to the semiconductor layers LA1 through LAn through global conductive lines, and column address buffer 842C supplies a column address Yadd to the semiconductor layers LA1 through LAn through the global conductive lines. As an example of realizing the global conductive lines, the global conductive lines that transmit a row address Xadd may be separately disposed from the semiconductor layers LA1 through LAn, and the global conductive lines that transmit a column address Yadd may also be separately disposed from the semiconductor layers LA1 through LAn. Also, the global conductive lines for transmitting data between the semiconductor layers LA1 through LAn and the input/output buffer 843C may be separately disposed from the semiconductor layers LA1 through LAn.

Figure 17D:
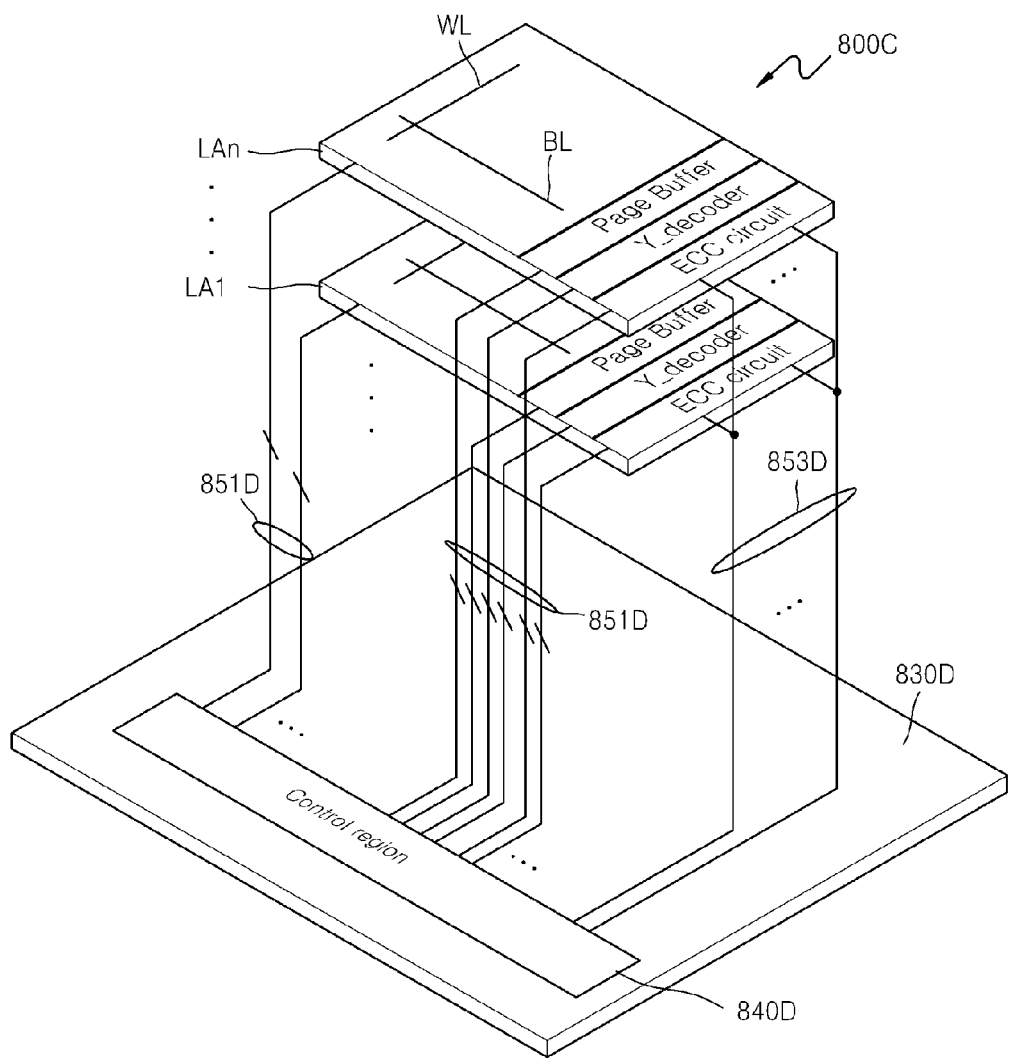

FIG. 17D shows an example of the disposition of logic circuits on the semiconductor layers LA1 through LAn besides a row decoder and a column decoder.

As shown in FIG. 17D, a semiconductor memory device 800D may include a semiconductor substrate 830D and a plurality of semiconductor layers LA1 through LAn stacked above semiconductor substrate 830D. The semiconductor layers LA1 through LAn respectively may include a memory cell region 810D and a logic region. The logic region may include various logic circuits. For example, in FIG. 17D, a page buffer 821D, a column decoder 822D, and an ECC circuit 823D are disposed in the logic region. As disclosed in the article "Quantized conductance atomic switch" by K. Terable et al., published in Nature, 2005, a logic element such as AND, OR, or NOT GATE may be realized as a resistor switch. Therefore, it is seen that the realization of various logic circuit is possible through the combination of logic elements.

Semiconductor substrate 830D may include a control region 840D for supporting a memory operation of semiconductor memory device 800D. Control region 840D communicates various signals with the semiconductor layers LA1 through LAn through a plurality of global conductive lines 851D through 853D. For example, in order to select word lines WL, a word line signal is transmitted from control region 840D to the semiconductor layers LA1 through LAn through global conductive lines 851D. Also, a signal for controlling various logic circuits disposed in a logic region is transmitted to the semiconductor layers LA1 through LAn through global conductive lines 852D. A write/read operation of data is supported based on the control operation described above, and the resulted data is transmitted between the semiconductor layers LA1 through LAn and semiconductor substrate 830D through global conductive lines 853D.

When logic circuits are disposed in the logic regions of the semiconductor layers LA1 through LAn, it is necessary to select and dispose logic circuits having a predetermined characteristic among the various kinds of logic circuits for supporting a memory operation. For example, the logic circuits may include a circuit group that is locally used in the semiconductor layers LA1 through LAn and a circuit group that is globally used in the semiconductor layers LA1 through LAn. When the logic circuits are disposed in the logic region, at least one logic circuit selected from the circuit group that is locally used in the semiconductor layers LA1 through LAn may be disposed in the logic region.

The logic circuits may include a circuit group that includes resistor switch based logic circuits and perform functions based on the switching operation thereof and another circuit group that includes logic circuits except the above logic circuits. In FIG. 17D, logic circuits such as a page buffer 821D, a column decoder 822D, and an ECC circuit 823D, which are disposed in a logic region. However, logic circuits different from the above logic circuits may be disposed in the logic region in consideration of the characteristics of the above logic circuits.

Figure 18A:
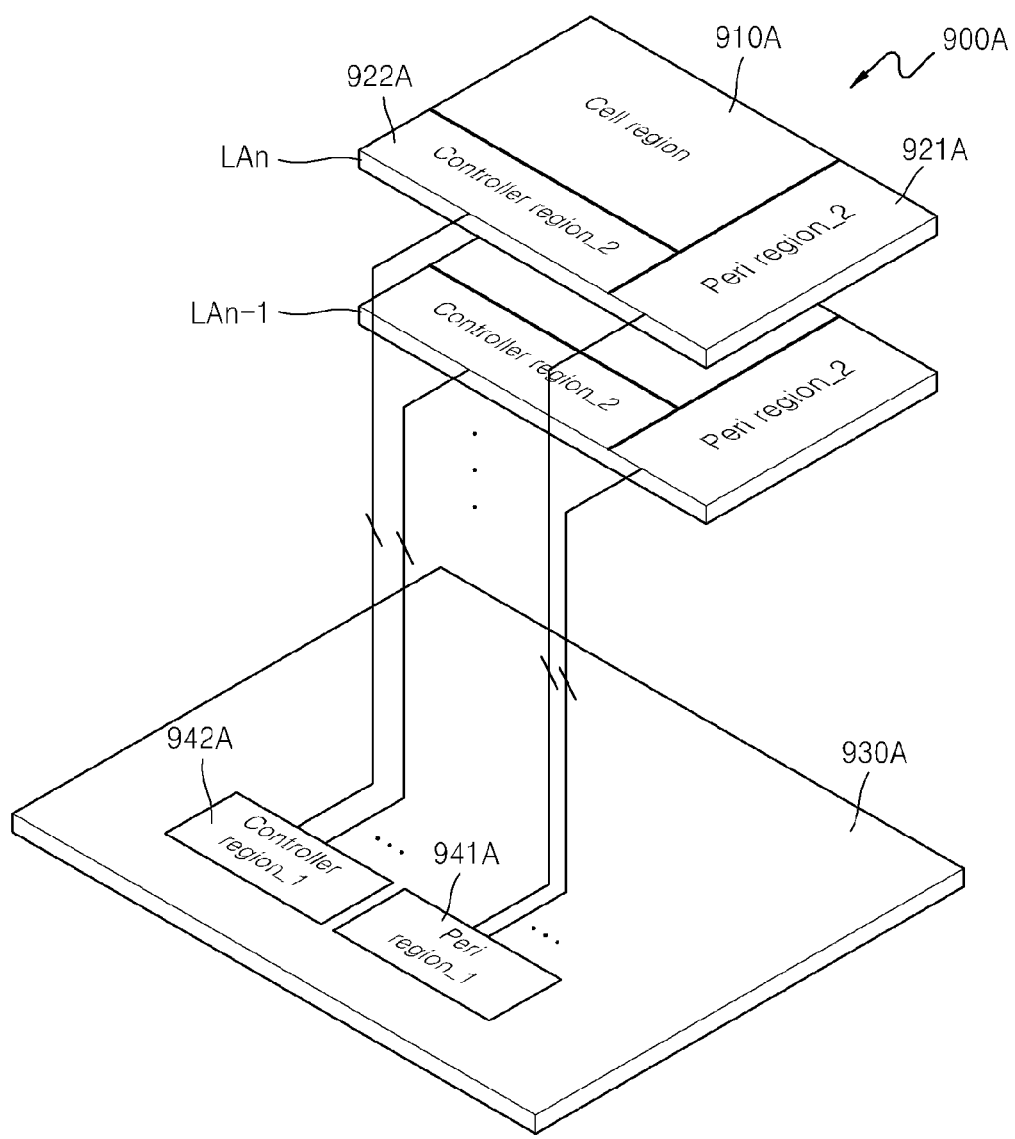
FIGS. 18A through 18C are block diagrams of semiconductor memory devices and systems according to another embodiment of the inventive concept.
Figure 18B:
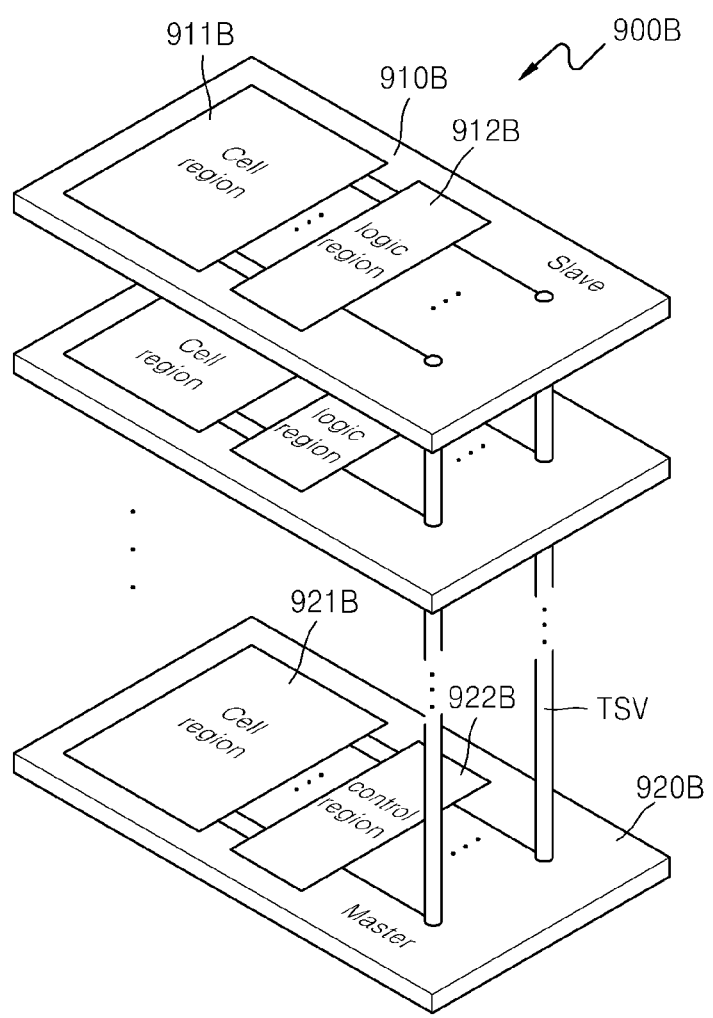
Figure 18C:
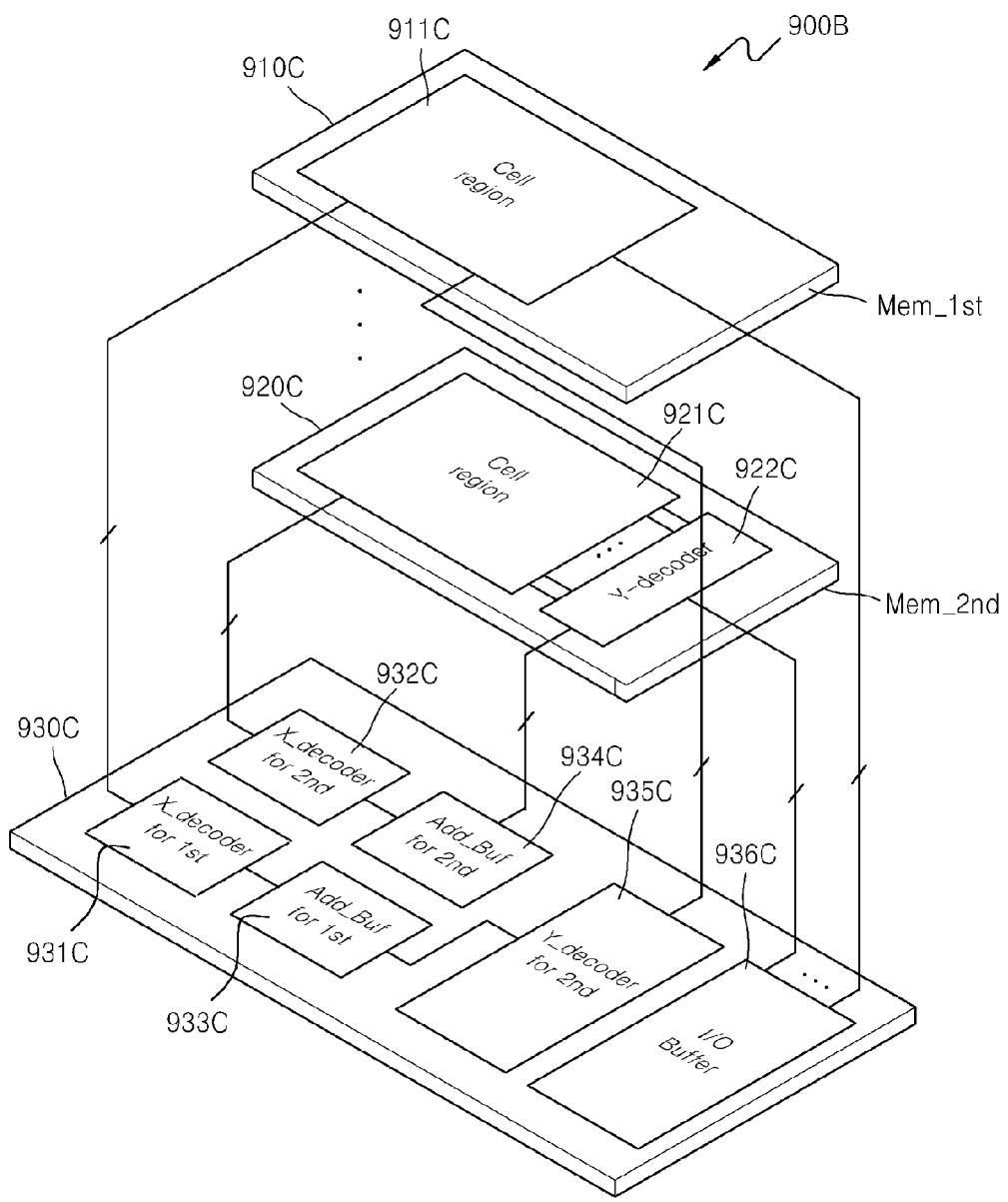

FIGS. 18A through 18C are block diagrams of semiconductor memory devices and systems according to another embodiment of the inventive concept. FIG. 18A shows a memory system 900A of a semiconductor memory device having a three dimensional stack structure. Memory system 900A may include a memory cell region 910A, circuit regions 921A and 941A that support the memory operation, and controller regions 922A and 942A for controlling the memory device. In order to clearly distinguish a memory device and a controller, circuit region 921A and 941A for supporting a memory operation may be referred to as a peripheral region included in the memory device.

The peripheral circuit and the controller respectively may include a plurality of logic circuits. Also, the peripheral circuit and the controller respectively may include logic circuits that may be realized as resistor switch based logic circuits, and may include logic circuits that may be locally used in each of the semiconductor layers LA1 through LAn. Thus, some of the peripheral circuits and the controllers respectively are disposed on a semiconductor substrate 930A, and the rest of the logic circuits may be respectively disposed on each of the semiconductor layers LA1 through LAn. As depicted in FIG. 18A, a first controller region 942A and a second controller region 922A constitute the controller region, and first controller region 942A is disposed on semiconductor substrate 930A and second controller region 922A is disposed on each of the semiconductor layers LA1 through LAn. Similarly, a first peripheral circuit region 941A is disposed on semiconductor substrate 930A and a second peripheral circuit region 921A is disposed on each of the semiconductor layers LA1 through LAn.

In FIG. 18B, global conductive lines between the semiconductor layers LA1 through LAn are realized in through silicon vias (TSV) in a semiconductor memory device 900B having a stacking structure. Semiconductor memory device 900B may include a plurality of silicon substrate, and lowermost silicon substrate 920B functions as a master and silicon substrates 910B stacked on lowermost silicon substrate 920B function as slaves.

Various memory cells may be disposed on the substrates included in semiconductor memory device 900B. Generally, a memory cell region 911B may be disposed on each of silicon substrates 910B, and also, master substrate 920B may include a memory cell region 921B. Also, a driving circuit for supporting a memory operation may be included in semiconductor memory device 900B. Some of logic circuits of the driving circuit are disposed in control region 922B of master silicon substrate 920B, and the rest of the logic circuits are disposed in logic region 912B of slave substrates 910B.

As described above, a unit cell of a memory cell is realized using at least one element. In realizing logic region 912B of slave substrate 910B, logic region 912B is realized by an element as the same element included in the unit structure of the memory cell. For example, when a memory cell region 911B of slave substrate 910 is realized as a resistive memory that includes a resistive device, logic region 912B is formed to include a resistor switch that uses the resistive device. In this case, the TSVs connected through silicon substrates 910B may be included in semiconductor memory device 900D for transmitting vertical signals between silicon substrates 910B and 920B.

FIG. 18C shows that a semiconductor memory device 900C includes different type memories. Semiconductor memory device 900C may include a semiconductor substrate 930C and a plurality of semiconductor layers 910C and 920C stacked on semiconductor substrate 930C. Some of the semiconductor layers (e.g., a first layer 910C) may include a cell region 911C on which a first type memory cells are disposed, and the rest of the semiconductor layers (a second layer 920C)

may include a cell region 921C on which a second type memory cells are disposed. For example, first layer 910C may include a volatile memory such as a DRAM, and second layer 920C may include a non-volatile memory such as a resistive memory. Meanwhile, semiconductor substrate 930C may include various logic circuits for supporting a memory operation, for example, row decoders 931C and 932C, address buffers 933C and 934C, a column decoder 935C for first layer 910C, and an input/output buffer 936C. In FIG. 18C, the decoders and the buffers for the first layer and the second layer are separately depicted on semiconductor substrate 930C. This may be understood that the decoders and the buffers may be separately configured in each of the layers.

When second layer 920C includes cell region 921C on which the resistive memory is disposed, the logic circuit (for example, a column decoder) may be realized by using a device the same as the resistive device of the resistive memory. Accordingly, a resistor switch based logic circuit (for example, a column decoder) realized by the resistive device may be disposed on second layer 920C. However, if the realization of a logic circuit is impossible using a device included in cell region 911C of first layer 910C or the realization is not easy, the logic circuit for first layer 910C may be disposed on semiconductor substrate 930C based on a CMOS circuit.

In this way, in semiconductor memory device 900C that includes different kinds of memories as depicted in FIG. 18C, a memory that stores a system data and, at the same time, a memory that has a large capacity data storage may be included since a random access to semiconductor memory device 900C is possible. Since a plurality of second layers 920C are included in semiconductor memory device 900C to store a large capacity data, an area for driving circuits and global conductive lines for driving a memory of second layer 920C is increased. However, according to the embodiment of the inventive concept, since some of the logic circuits for driving the memory of second layer 920C are disposed on second layer 920C, a constraint according to the increase in the area of the driving circuits and the area of the global conductive lines may be reduced.

Figure 19:
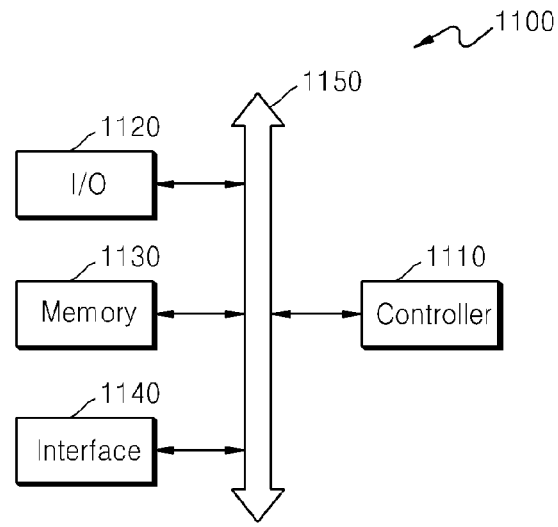
FIG. 19 is a block diagram showing an example of a memory system that includes semiconductor memory devices according to the embodiments of the inventive concept.

FIG. 19 is a block diagram showing an example of a memory system 1100 that includes semiconductor memory devices according to the embodiments of the inventive concept.

Referring to FIG. 19, memory system 1100 may be applied to all systems that use a memory device such as PDAs, portable computers, web tablets, wireless phones, mobile phones, digital music players, memory cards, or systems that transmit and receive information in a wireless environment.

Memory system 1100 may include a controller 1110, an input/output device 1120 such as a keypad, keyboard, and a display, a memory device 1130, an interface 1140, and a bus 1150. Memory device 1130 and interface 1140 communicate through bus 1150.

Controller 1110 may include at least a microprocessor, a digital signal processor, a microcontroller, or some other process devices similar to the processors above. Memory device 1130 may be used for storing commands performed by controller 1110. Input/output device 1120 is a device for receiving data from the outside of system 1100 and for outputting data or signals from system 1110 to an external device. For example, input/output device 1120 may include a keyboard, a keypad, or a display device.

Memory device 1130 may include a semiconductor memory device having a stacking structure according to the embodiment of the inventive concept. Memory device 1130 may include a non-volatile memory, a different kind of memory, for example, a non-volatile memory to which arbitrary access is possible, or both volatile and non-volatile memories. Interface 1140 may transmit data to a communication network or may receive data from the network.

Figure 20:
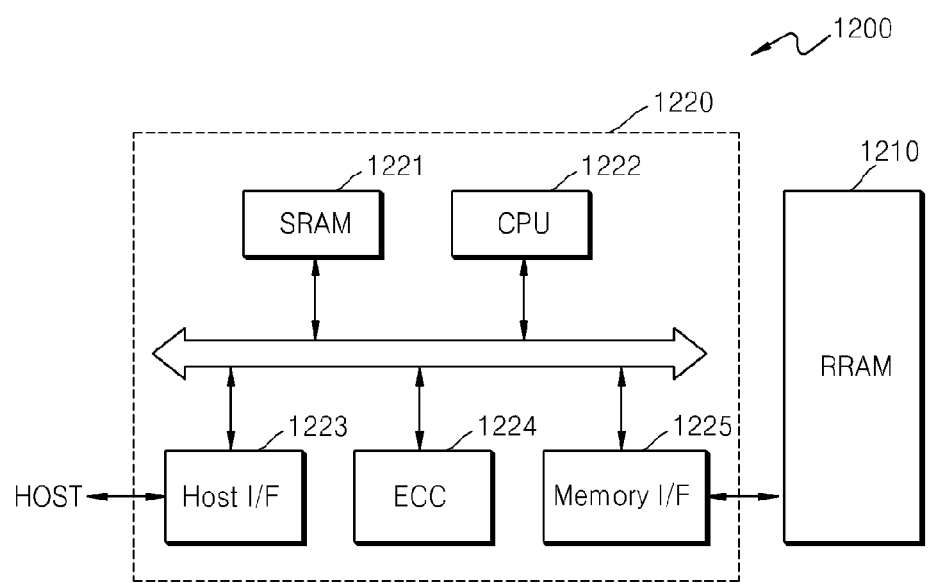
FIG. 20 is a block diagram showing an example of a memory card including the semiconductor memory devices according to the embodiments of the inventive concept.

FIG. 20 is a block diagram showing an example of a memory card 1200 that includes semiconductor memory devices according to the embodiments of the inventive concept.

Referring to FIG. 20, memory card 1200 for supporting a large data storing capacity may include a memory device 1210 according to the embodiment of the inventive concept. Memory device 1210 may be a RRAM that includes a resistive memory. Memory card 1200 may include a memory controller 1220 that controls all data exchange between a HOST and memory device 1210.

An SRAM 1221 is used as an operation memory of a processing unit 1222. A host interface 1223 includes a data exchange protocol of the HOST connected to memory card 1200. An error correction block 1224 detects error included in data read out from memory device 1210 and corrects the error. A memory interface 1225 interfaces with memory device 1210 to transmit or receive data. A processing unit 1222 performs all control operations for data exchange of memory controller 1220. Although not shown, it will be understood by those of ordinary skill in the art that memory card 1200 may further include a ROM that stores a code data for interfacing with the host.

Figure 21:
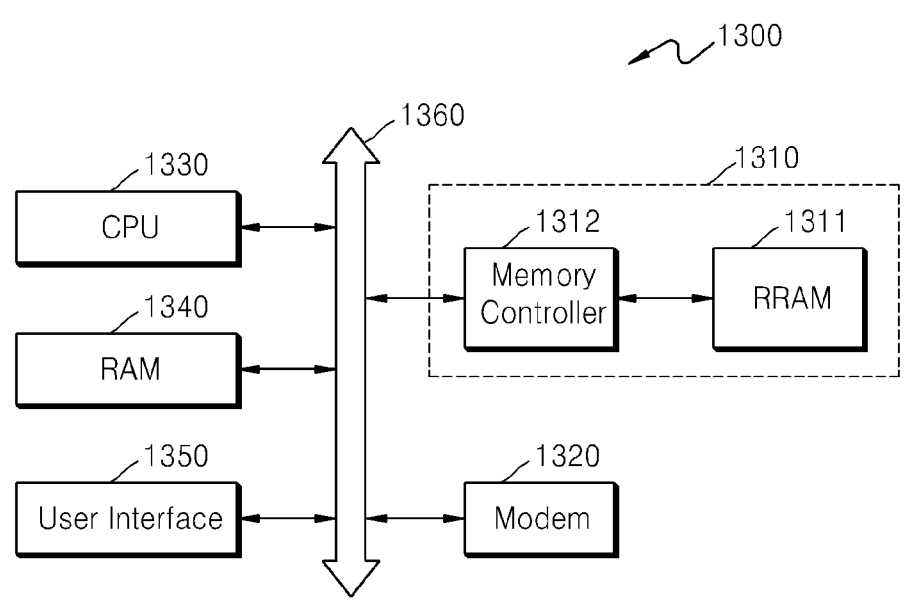
FIG. 21 is a block diagram showing an example of an information system having the semiconductor memory system according to an embodiment of the inventive concept.

FIG. 21 is a block diagram showing an example of an information processing system 1300 having the semiconductor memory system according to an embodiment of the inventive concept.

Referring to FIG. 21, a memory system 1310 according to the embodiment of the inventive concept may be applied to information processing systems such as mobile instruments or desktop computers. In FIG. 21, as an example of memory system 1310, an RRAM system that has a stacking structure and includes a resistive memory is depicted. Memory system 1310 may include an RRAM 1311 and a memory controller 1312 for controlling a memory operation. Information processing system 1300 according to the inventive concept may include memory system 1310 and a modem 1320, a central process unit 1330, a RAM 1340, and a user interface 1350 respectively electrically connected to a system bus 1360. Data processed in central process unit 1330 or data received from an external device is stored in memory system 1310. Memory system 1310 may be configured as a semiconductor disc device SSD, and in this case, information processing system 1300 may safely store a large capacity of data in the memory system 1310. Although not shown, it will be understood by those of ordinary skill in the art that the information processing system 1300 may further include an application chipset, a camera image processor CIS, and/or an input/output device.

While the inventive concept has been particularly shown and described with reference to exemplary embodiments thereof, it will be understood that various changes in form and details may be made therein without departing from the spirit and scope of the following claims.

What is claimed is:
1. A semiconductor memory device comprising:
   a first conductive line, including a first line portion and a second line portion, wherein the first line portion and the second line portion are electrically separated from each other by an intermediate region disposed between the first and second line portions;
   a first variable resistance material film that is connected to the first line portion and stores data; and a second variable resistance material film that is configured to control an electrical connection between the first line portion and the second line portion.

2. The semiconductor memory device of claim 1, wherein the second variable resistance material film is formed in the intermediate region and contacts the first line portion and the second line portion.

3. The semiconductor memory device of claim 1, further comprising second conductive lines disposed in a perpendicular direction to the first conductive line on the first and second variable resistance material film.

4. The semiconductor memory device of claim 3, wherein the second conductive lines comprise:
   an access line that is disposed on the first variable resistance material film and is configured to transmit an access signal to access the first variable resistance material film; and
   a control line that is disposed on the second variable resistance material film and is configured to transmit a control signal for controlling a switching operation of a switching device.

5. The semiconductor memory device of claim 1, further comprising a diode that is disposed adjacent to the first variable resistance material film and is configured to perform a switching operation.

6. The semiconductor memory device of claim 1, wherein the first and second variable resistance material films respectively are formed of a material selected from the group consisting of a transition metal oxide (TMO), a solid-electrolyte, and a perovskite group compound.

7. The semiconductor memory device of claim 1, wherein the first and second variable resistance material films comprise a same variable resistance material as each other.

8. The semiconductor memory device of claim 1, further comprising an upper electrode and a lower electrode that are disposed between the first and second conductive lines and also are respectively disposed on and under the first variable resistance material film.

\* \* \* \* \*